United States Patent
Murakami et al.

(10) Patent No.: US 8,453,042 B2
(45) Date of Patent: May 28, 2013

(54) MODULATOR AND MODULATION METHOD

(75) Inventors: Yutaka Murakami, Osaka (JP); Shutai Okamura, Osaka (JP); Kiyotaka Kobayashi, Osaka (JP); Masayuki Orihashi, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/493,721

(22) Filed: Jun. 11, 2012

(65) Prior Publication Data

US 2012/0254701 A1 Oct. 4, 2012

Related U.S. Application Data

(63) Continuation of application No. 13/190,158, filed on Jul. 25, 2011, now Pat. No. 8,219,865, which is a continuation of application No. 12/688,658, filed on Jan. 15, 2010, now Pat. No. 8,010,858, which is a continuation of application No. 11/994,624, filed as application No. PCT/JP2006/313334 on Jul. 4, 2006, now Pat. No. 7,676,719.

(30) Foreign Application Priority Data

Jul. 6, 2005 (JP) ................. 2005-198177

(51) Int. Cl.
*G06F 11/00* (2006.01)
*H03M 13/00* (2006.01)

(52) U.S. Cl.
USPC .......................................... 714/800

(58) Field of Classification Search
USPC ................. 714/746, 758, 786, 800
See application file for complete search history.

(56) References Cited

U.S. PATENT DOCUMENTS

| 6,963,622 B2 | 11/2005 | Eroz |
| 6,990,627 B2 | 1/2006 | Uesugi |

(Continued)

FOREIGN PATENT DOCUMENTS

| JP | 2003/046586 | 2/2003 |
| JP | 2003/051760 | 2/2003 |

(Continued)

OTHER PUBLICATIONS

Vanderaar et al., A low complexity digital encoder modulator for high data rate satellite BISDN Applications, 1996, IEEE, p. 357-363.*

(Continued)

*Primary Examiner* — Shelly A Chase
(74) *Attorney, Agent, or Firm* — Dickinson Wright PLLC

(57) ABSTRACT

A transmitter apparatus wherein a relatively simple structure is used to suppress burst errors without changing the block sizes of encoded blocks even when the number of modulation multi-values is increased. An encoding part subjects transport data to a block encoding process to form block encoded data. A modulating part modulates the block encoded data to form data symbols; and an arranging (interleaving) part arranges (interleaves) the block encoded data in such a manner that the intra-block encoded data of the encoded blocks, which include their respective single different data symbol, get together, and then supplies the arranged (interleaved) block encoded data to the modulating part. In this way, there can be provided a transmitter apparatus wherein a relatively simple structure is used to suppress burst errors without changing the block sizes of encoded blocks even when the number of modulation multi-values is increased.

12 Claims, 27 Drawing Sheets

U.S. PATENT DOCUMENTS

| | | | |
|---|---|---|---|
| 7,062,700 B2 * | 6/2006 | Shen et al. | 714/792 |
| 7,069,489 B2 | 6/2006 | Murakami | |
| 7,139,964 B2 | 11/2006 | Shen | |
| 7,206,606 B2 | 4/2007 | Kobayashi | |
| 7,248,647 B2 * | 7/2007 | Claussen et al. | 375/308 |
| 7,260,764 B2 | 8/2007 | Chen | |
| 7,281,189 B2 * | 10/2007 | Sudo | 714/755 |
| 7,322,005 B2 | 1/2008 | Shen | |
| 7,389,464 B2 * | 6/2008 | Jeong et al. | 714/752 |
| 7,436,806 B2 | 10/2008 | Hwang | |
| 7,453,947 B2 | 11/2008 | Kim | |

FOREIGN PATENT DOCUMENTS

| | | |
|---|---|---|
| JP | 2003/158506 | 5/2003 |
| JP | 2003/169039 | 6/2003 |
| JP | 2003-174428 | 6/2003 |
| JP | 2003-309535 | 10/2003 |
| JP | 2004-159303 | 6/2004 |
| JP | 2004-179821 | 6/2004 |
| JP | 2004-21525 | 7/2004 |
| WO | 2004/049596 | 6/2004 |
| WO | 2004/049617 | 6/2004 |

OTHER PUBLICATIONS

International Search Report dated Sep. 19, 2006.
"High-speed Physical LayeR (PHY) in the 5 GHZ Band," IEEE Standards Board, 802.11a 1999, Part 11: Wireless LAN Medium Access Control(MAC) and Physical Layer (PHY) specifications, Sep. 1999, pp. 1-82.
Notice of the Reasons for Rejection dated May 25, 2010.

* cited by examiner

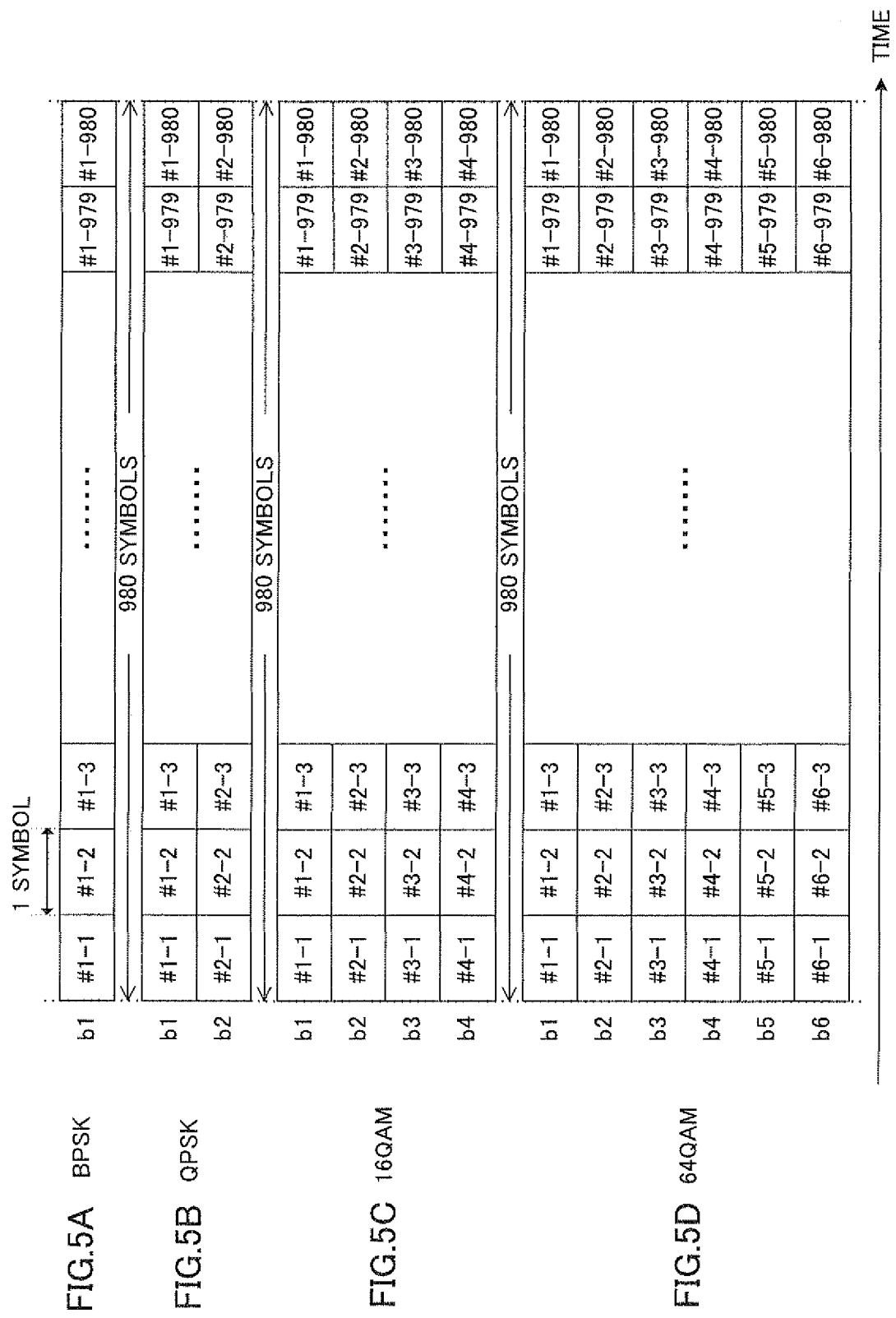

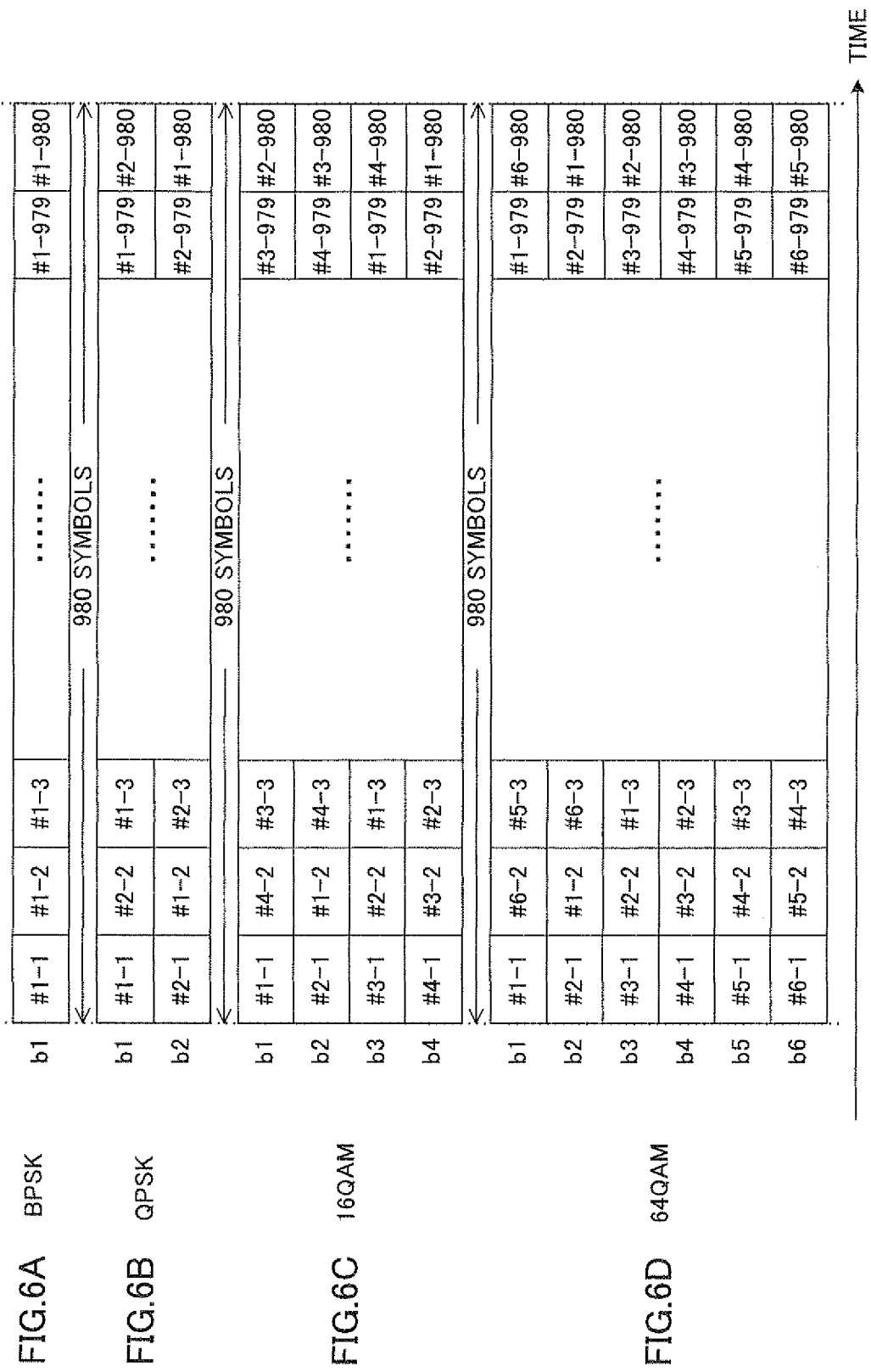

FIG.7A BPSK

| b1 | #1-1 | #1-2 | #1-3 | #1-4 | ...... | #1-979 | #1-980 |
|---|---|---|---|---|---|---|---|

980 SYMBOLS

FIG.7B QPSK

| b1 | #1-1 | #2-1 | #1-3 | #2-3 | ...... | #1-979 | #2-979 |
|---|---|---|---|---|---|---|---|
| b2 | #1-2 | #2-2 | #1-4 | #2-4 | ...... | #1-980 | #2-980 |

980 SYMBOLS

FIG.7C 16QAM

| b1 | #1-1 | #2-1 | #3-1 | #4-1 | ...... | #3-977 | #4-977 |
|---|---|---|---|---|---|---|---|
| b2 | #1-2 | #2-2 | #3-2 | #4-1 | ...... | #3-978 | #4-978 |
| b3 | #1-3 | #2-3 | #3-3 | #4-1 | ...... | #3-979 | #4-979 |
| b4 | #1-4 | #2-4 | #3-4 | #4-1 | ...... | #3-980 | #4-980 |

980 SYMBOLS

FIG.7D 64QAM

| b1 | #1-1 | #2-1 | #3-1 | #4-1 | ...... | #1-979 | #4-979 |
|---|---|---|---|---|---|---|---|
| b2 | #1-2 | #2-2 | #3-2 | #4-2 | ...... | #1-980 | #4-980 |
| b3 | #1-3 | #2-3 | #3-3 | #4-3 | ...... | #2-979 | #5-979 |
| b4 | #1-4 | #2-4 | #3-4 | #4-4 | ...... | #2-980 | #5-980 |
| b5 | #1-5 | #2-5 | #3-5 | #4-5 | ...... | #3-979 | #6-979 |
| b6 | #1-6 | #2-6 | #3-6 | #4-6 | ...... | #3-980 | #6-980 |

TIME →

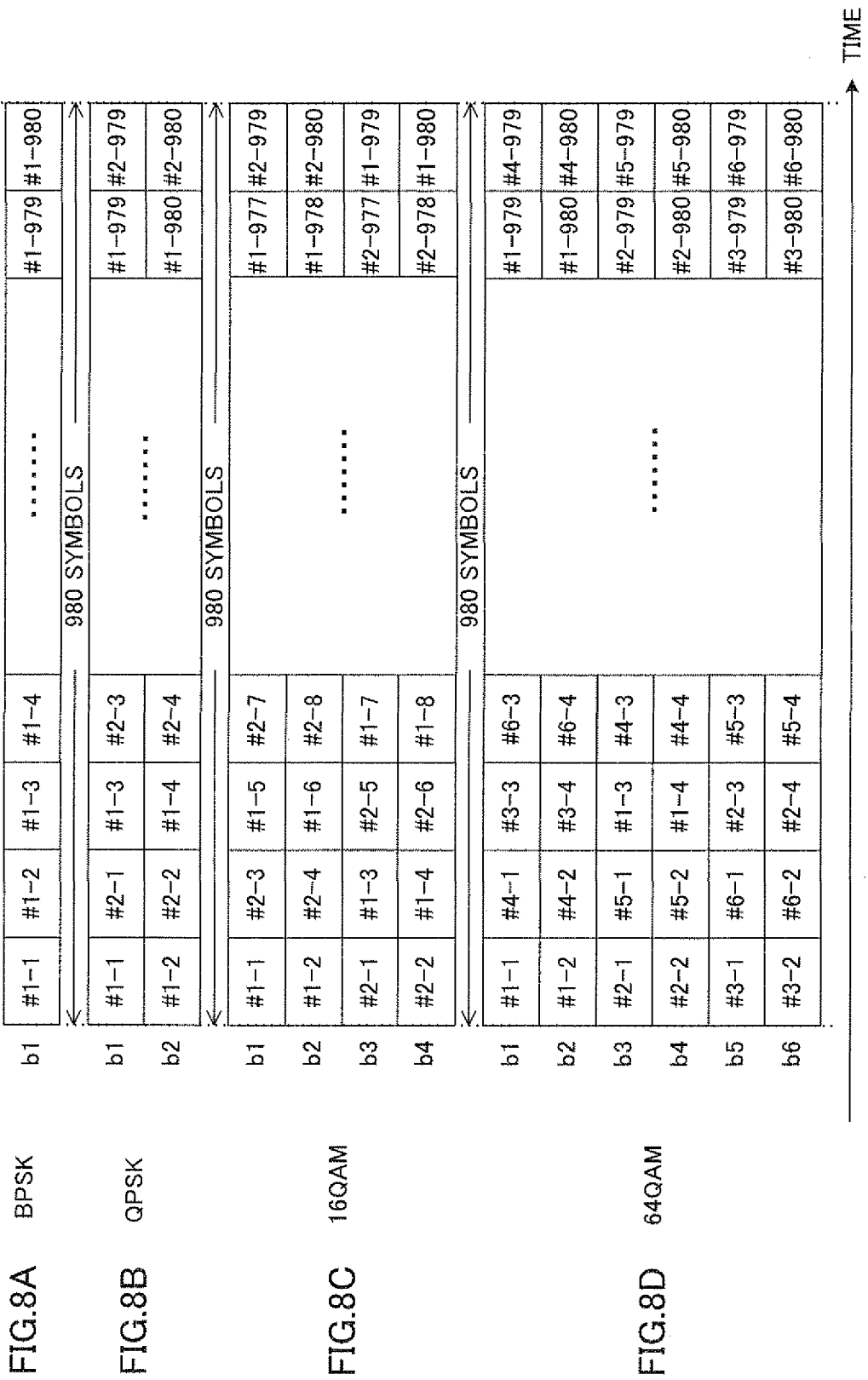

PREAMBLE  PILOT SYMBOL  DATA SYMBOL

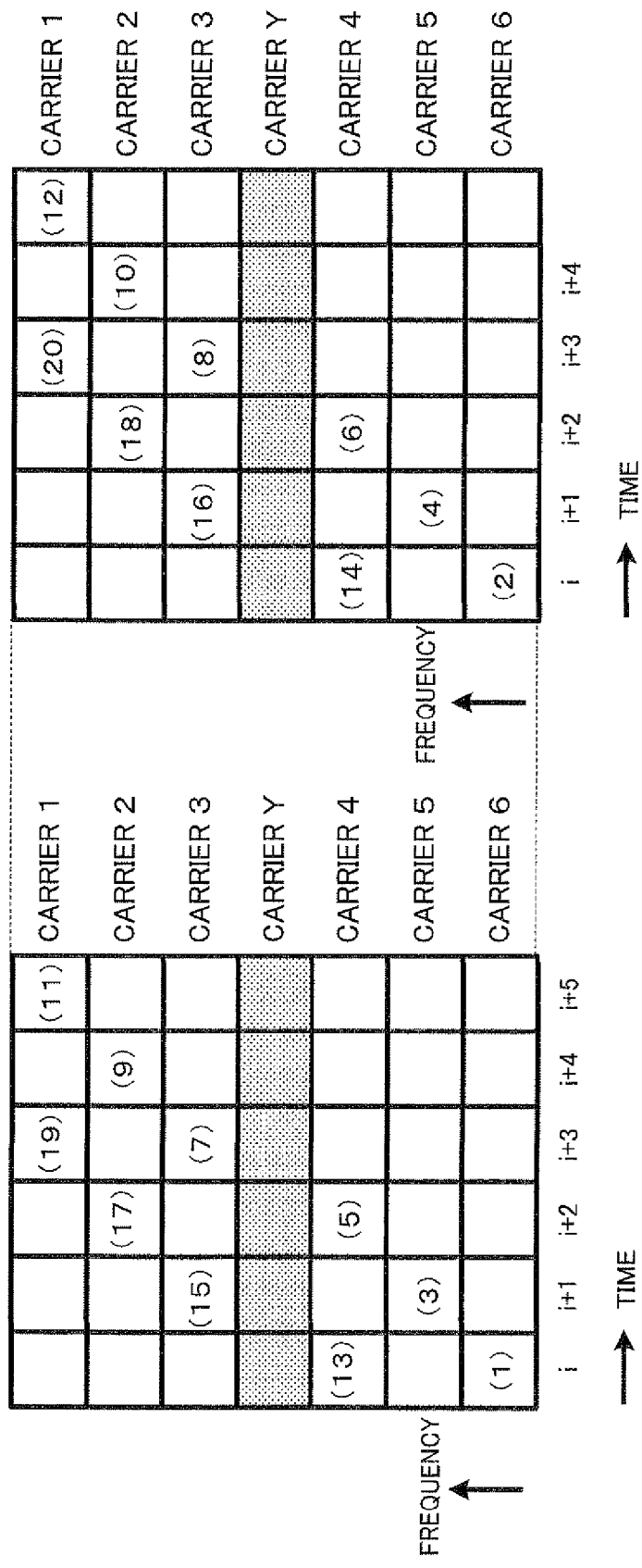

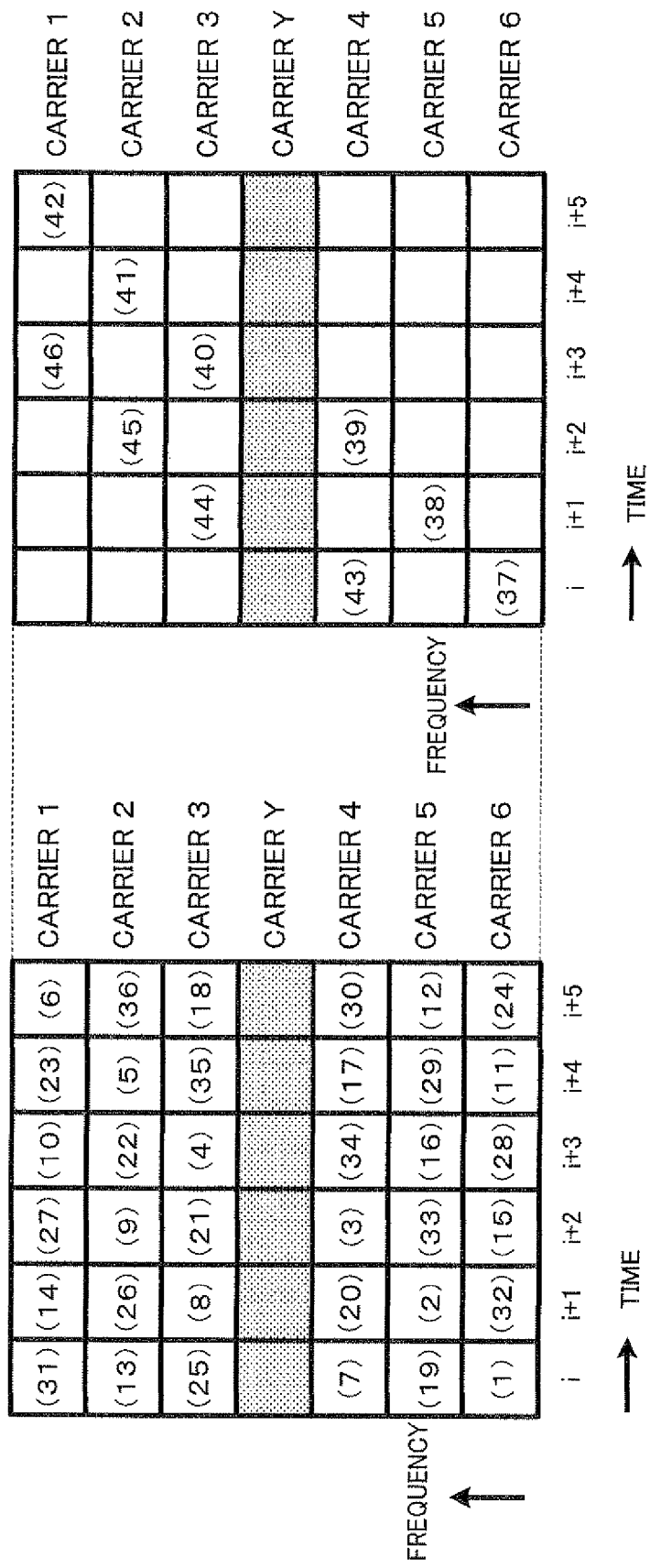

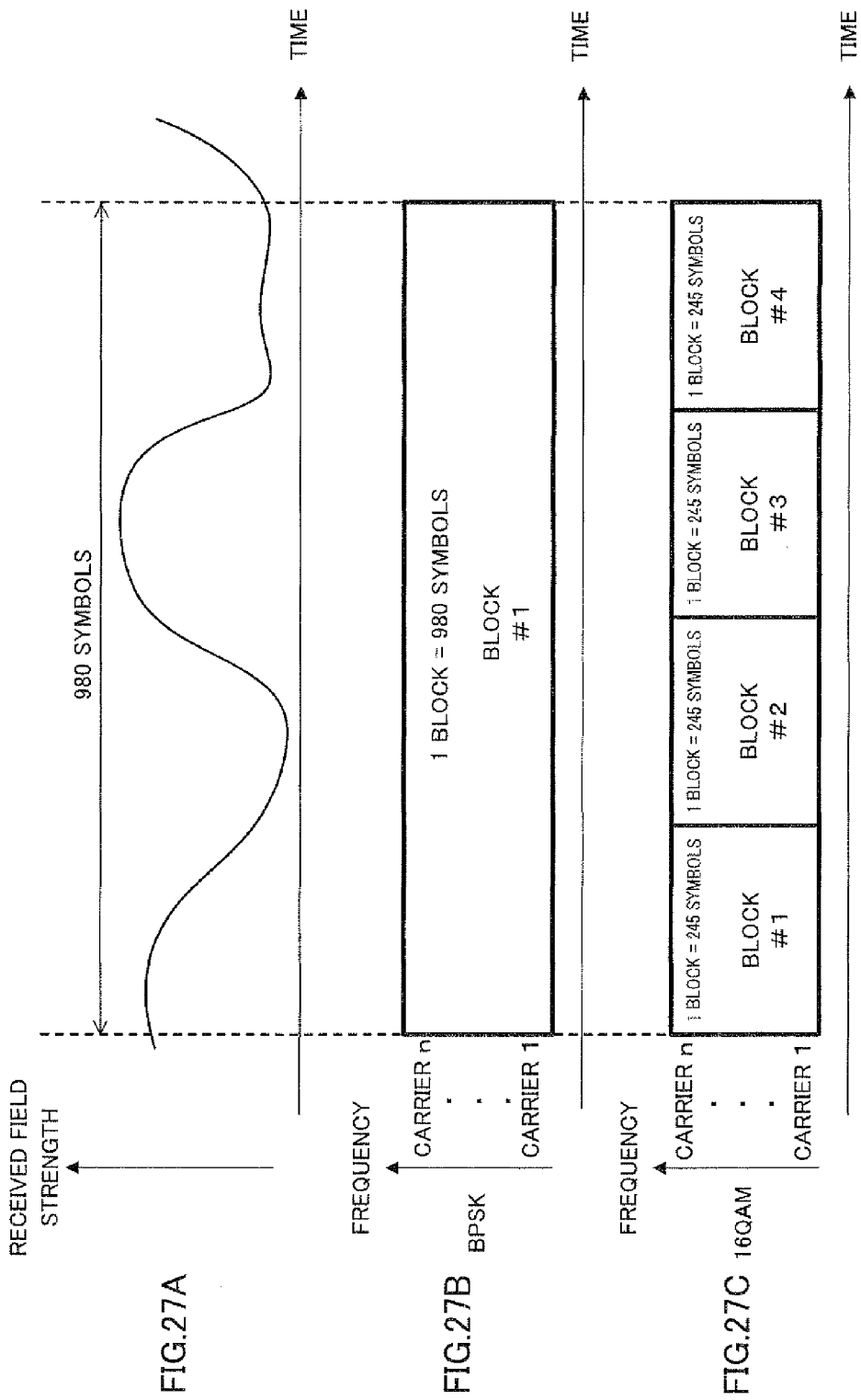

MODULATOR AND MODULATION METHOD

This is a continuation application of application Ser. No. 13/190,158 filed Jul. 25, 2011, which is a continuation application of application Ser. No. 12/688,658 filed Jan. 15, 2010, which is a continuation application of application Ser. No. 11/994,624 filed Jan. 3, 2008, which is a 371 application of PCT/JP2006/313334 filed Jul. 4, 2006, which is based on Japanese Application No. 2005-198177 filed Jul. 6, 2005, the entire contents of each of which are incorporated by reference herein.

TECHNICAL FIELD

The present invention relates to a transmitting apparatus and multi-antenna transmitting apparatus that encode transmit data using a block code such as an LDPC (Low Density Parity Cheek) code, for example, and transmit that transmit data.

BACKGROUND ART

In radio communications, transmit data is generally encoded before transmission in order to improve error correction capability. One example of such encoding is the use of an LDPC code such as described in Non-patent Document 1. This LDPC code enables error correction to be performed using an extremely large block unit (constraint length), and is therefore considered to be resistant to burst errors and suitable for communications in a fading environment.

Also, a multi-antenna transmitting apparatus that transmits OFDM signals from a plurality of antennas, such as described in Non-patent Document 2, is known as a technology for improving data transmission speed. With this kind of multi-antenna transmitting apparatus, interleaving data in the frequency direction (subcarrier direction) has been proposed as one method of suppressing burst errors due to frequency selective fading.

FIG. 1 shows an example of the frame configuration of a transmit signal in this kind of multi-antenna transmitting apparatus. In FIG. 1, a preamble for estimating distortion due to fading fluctuation—that is, channel estimation—and frequency offset between the transmitter and receiver are placed at the head of a frame, followed by data symbols. Also, pilot symbols for estimating frequency offset that fluctuates over time are placed in carrier Y. One square in FIG. 1 represents one symbol. That is to say, in the example shown in FIG. 1, one OFDM symbol composed of a total—of 7 symbols (data symbols and a pilot symbol) is transmitted at each of times i, i+1, .... At this time, data is interleaved and placed in (1) (2) (3) ... (11) (12) order within one OFDM symbol.

Non-patent Document 1: "Low Density Parity Check Encoding and Decoding Method, LDPC (Low Density Parity) Encoding/Sum-Product Decoding Method" Triceps 2002

Non-patent Document 2: "High Speed Physical Layer (PHY) in 5 GHz band" IEEE802.11a 1999

DISCLOSURE OF INVENTION

Problems to be Solved by the Invention

When a block code such as LDPC code is used, as the number of modulation multi-values increases, for example, the number of symbols for transmitting one encoded block decreases, and one encoded block is transmitted in a shorter time. As a result, if there is a notch due to fading in this transmission period, a burst error is liable to occur. That is to say, the probability of a burst error increases as the number of modulation multi-values increases.

With a block code such as LDPC code, the block size can be changed, and the larger the block size (that is, the longer the constraint length), the smaller is the probability of a burst error due to a fading notch or the like. Therefore, when the number of modulation multi-values is varied as in the case of adaptive modulation, it is thought that burst errors can be suppressed by increasing the encoded block size as the number of modulation multi-values increases.

However, designing an encoder so as to change the block size each time the number of modulation multi-values is changed is not desirable due to the complexity of the configuration of such an encoder.

Also, in MIMO (Multiple-Input Multiple-Output) or similar multi-antenna transmission, while high separation precision can be secured for a data symbol immediately after the preamble placed at the head of a frame, enabling a high SNR to be obtained for a received signal, there has been a problem of separation precision declining with distance from the preamble, resulting in a decrease in the SNR of the received signal.

It is an object of the present invention to provide a transmitting apparatus that enables burst errors to be suppressed with a comparatively simple configuration without changing the block size of an encoded block even when the number of modulation multi-values is increased, and a multi-antenna transmitting apparatus that enables degradation of error rate performance due to distance from the preamble to be suppressed.

Modes for Solving the Problems

A transmitting apparatus of the present invention for solving the above problem employs a configuration that includes an encoding section that executes block encoding processing on transmit data and forms block encoded data, a modulation section that modulates block encoded data and forms data symbols, an arranging (interleaving) section that arranges (interleaves) block encoded data so that one data symbol is composed by collecting together intra-block data of different encoded blocks, and supplies the block encoded data to the modulation section, and a transmitting section that sequentially transmits data symbols.

A multi-antenna transmitting apparatus of the present invention transmits a preamble for signal separation simultaneously from a plurality of antennas and then transmits data symbols simultaneously from the plurality of antennas, and employs a configuration that includes an encoding section that executes block encoding processing on transmit data and forms block encoded data, a modulation section that modulates block encoded data and forms data symbols, an arranging (interleaving) section that arranges (interleaves) block encoded data so that one data symbol is composed by collecting together intra-block data of different encoded blocks, and supplies the block encoded data to the modulation section, and a transmitting section that sequentially transmits data symbols from the plurality of antennas.

Advantageous Effect of the Invention

According to the present invention, data in each encoded block are placed discretely in a plurality of symbols, enabling a transmitting apparatus to be implemented that can suppress burst errors, and can suppress degradation of error rate performance due to fading notches or the like by means of a comparatively simple configuration without changing the block size of encoded blocks, even when the number of modulation multi-values is increased.

Also, since the distance from the preamble can virtually be made uniform among encoded blocks, a multi-antenna transmitting apparatus can be implemented that can suppress degradation of error rate performance due to the distance from the preamble.

BRIEF DESCRIPTION OF DRAWINGS

FIG. 5 is a drawing showing first assignment examples of symbols of LDPC encoded data by an arranging (interleaving) section, wherein FIG. 5A is a drawing showing bit assignment to each symbol in the case of BPSK, FIG. 5B is a drawing showing bit assignment to each symbol in the case of QPSK, FIG. 5C is a drawing showing bit assignment to each symbol in the case of 16QAM, and FIG. 5D is a drawing showing bit assignment to each symbol in the case of 64QAM;

FIG. 6 is a drawing showing second assignment examples of symbols of LDPC encoded data by an arranging (interleaving) section, wherein FIG. 6A is a drawing showing bit assignment to each symbol in the case of BPSK, FIG. 6B is a drawing showing bit assignment to each symbol in the case of QPSK, FIG. 6C is a drawing showing bit assignment to each symbol in the case of 16QAM, and FIG. 6D is a drawing showing bit assignment to each symbol in the case of 64QAM;

FIG. 7 is a drawing showing third assignment examples of symbols of LDPC encoded data by an arranging (interleaving) section, wherein FIG. 7A is a drawing showing bit assignment to each symbol in the case of BPSK, FIG. 7B is a drawing showing bit assignment to each symbol in the case of QPSK, FIG. 7C is a drawing showing bit assignment to each symbol in the case of 16QAM, and FIG. 7D is a drawing showing bit assignment to each symbol in the case of 64QAM;

FIG. 8 is a drawing showing fourth assignment examples of symbols of LDPC encoded data by an arranging (interleaving) section, wherein FIG. 8A is a drawing showing bit assignment to each symbol in the case of BPSK, FIG. 8B is a drawing showing bit assignment to each symbol in the case of QPSK, FIG. 8C is a drawing showing bit assignment to each symbol in the case of 16QAM, and FIG. 8D is a drawing showing bit assignment to each symbol in the case of 64QAM;

FIG. 19 is a drawing showing an example of arrangement (interleaving) processing of data after encoding;

FIG. 20 is a drawing showing an example of arrangement (interleaving) processing of data after encoding;

FIG. 26 is a drawing provided to explain Embodiment 4, wherein

FIG. 27 is a drawing provided, as an example for comparison, to explain degradation of reception quality characteristics due to the communication conditions when a conventional encoded block assignment method is applied, wherein FIG. 27A is a drawing showing the received field strength state, FIG. 27B is a drawing showing an example of a frame configuration when the modulation method is BPSK, and FIG. 27C is a drawing showing an example of a frame configuration when the modulation method is 16QAM.

BEST MODE FOR CARRYING OUT THE INVENTION

Embodiments of the present invention will now be described in detail with reference to the accompanying drawings.

Embodiment 1

Figure 1:
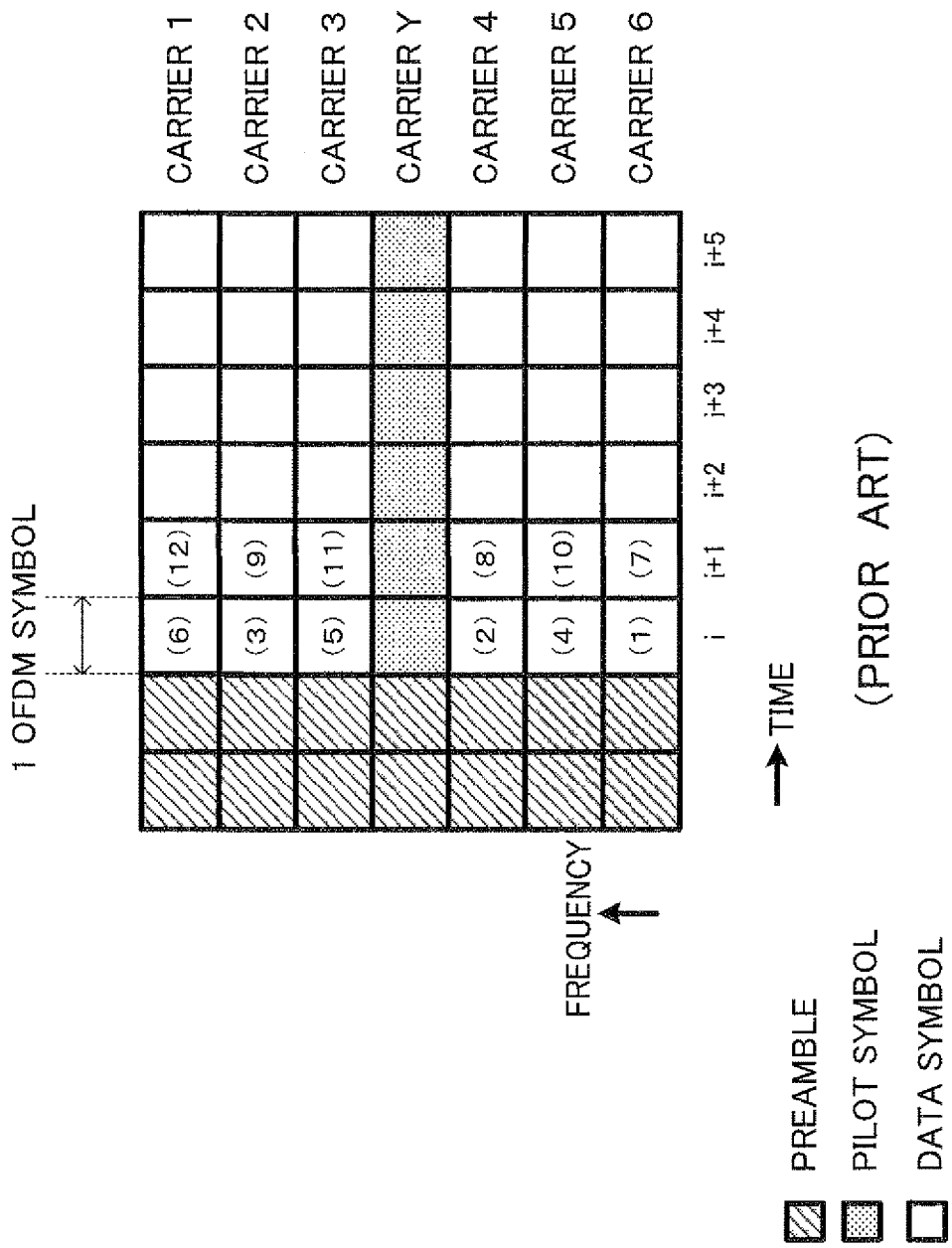
FIG. 1 is a drawing showing an example of the frame configuration of a transmit signal of a conventional multi-antenna transmitting apparatus.
Figure 2:
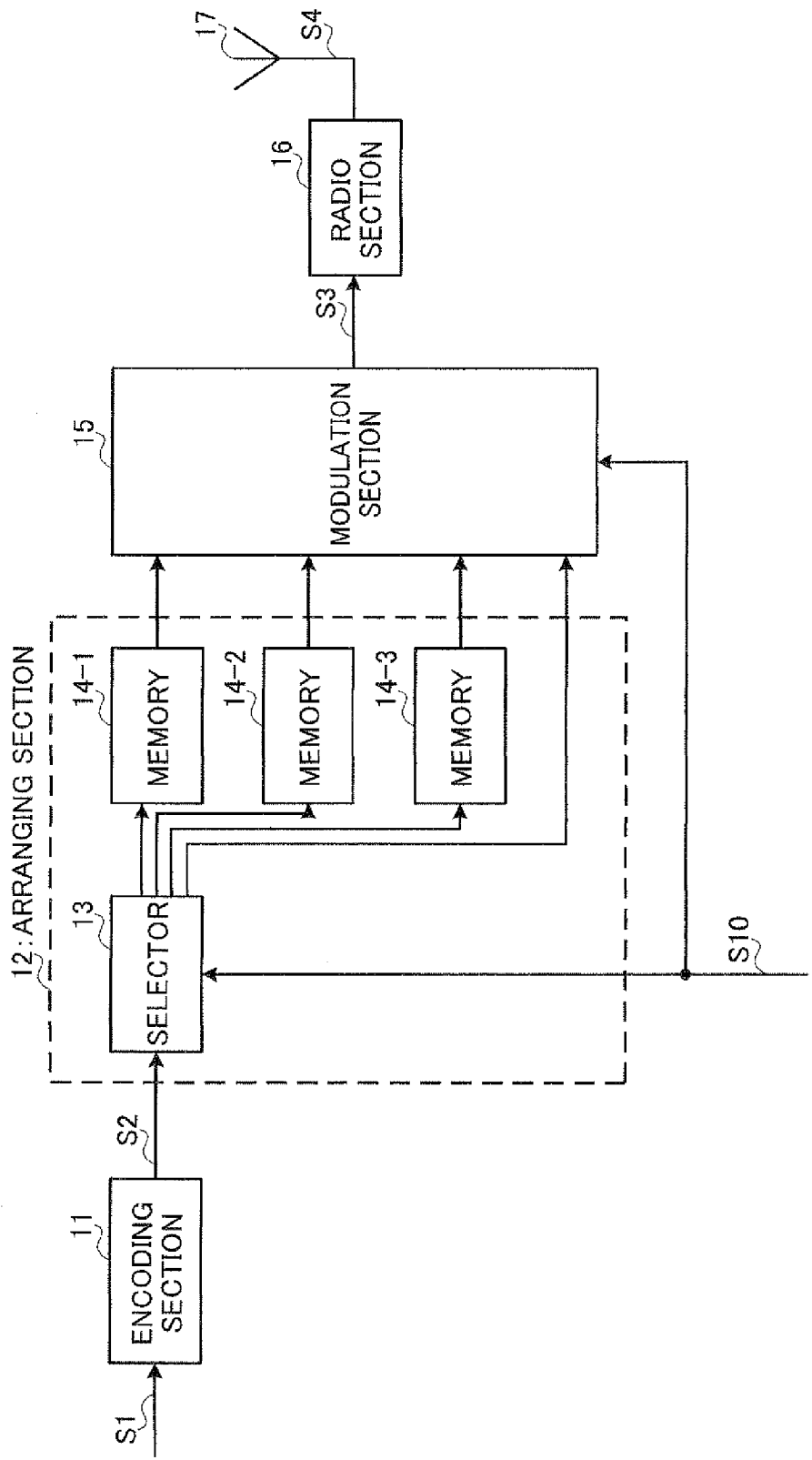
FIG. 2 is a block diagram showing the configuration of a transmitting apparatus according to Embodiment 1 of the present invention.

FIG. 2 shows the configuration of a transmitting apparatus according to Embodiment 1 of the present invention. In transmitting apparatus 10, transmit data S1 is input to an encoding section 11. Encoding section 11 executes block encoding processing on transmit data S1, and sends block encoded data S2 thus obtained to an arranging (interleaving) section 12. In this embodiment, encoding section 11 performs LDPC encoding processing.

Arranging (interleaving) section 12 arranges (interleaves) block encoded data 52 so that one data symbol is composed by collecting together intra-block data of different encoded blocks, and supplies arranged (interleaved) block encoded data S2 to a modulation section 15. Specifically, block encoded data S2 is input to a selector 13, and that selector 13 sends block encoded data S2 in bit units to memories 14-1 through 14-3 or modulation section 15. Memories 14-1 through 14-3 function as buffer memories, and send temporarily stored bits to modulation section 15 on a coordinated timing basis. For example, when modulation section 15 performs QPSK, memory 14-1 is used, and a bit stored in memory 14-1 is output at timing coordinated with a bit sent directly to modulation section 15 from selector 13. By this means, one QPSK symbol is formed by modulation section 15 using a total of two bits comprising a bit input from memory 14-1 and a bit input directly from selector 13. On the other hand, when modulation section 15 performs 16QAM, memories 14-1 through 14-3 are used, and bits stored in memories 14-1 through 14-3 are output at timing coordinated with a bit sent directly to modulation section 15 from selector 13. By this means, one 16QAM symbol is formed by modulation section 15 using a total of four bits comprising bits input from memories 14-1 through 14-3 and a bit input directly from selector 13.

To simplify the drawing, only three memories, 14-1 through 14-3, are shown in FIG. 2, but when modulation section 15 performs 64QAM, five memories are provided, and one 64QAM symbol is formed by modulation section 15 using a total of six bits comprising bits input from these memories and a bit input directly from selector 13.

The configuration of arranging (interleaving) section 12 shown in FIG. 2 is just one example, and any configuration may be used whereby block encoded data S2 is arranged (interleaved) and supplied to modulation section 15 so that encoded data in one block is assigned to a plurality of data symbols.

Modulation section 15 performs adaptive modulation based on a control signal S10. That is to say, modulation section 15 switches its modulation processing among BPSK, QPSK, 16QAM, and 64QAM based on control signal S10. Control signal S10 is also input to selector 13 of arranging (interleaving) section 12, and selector 13 changes the bit arrangement (interleaving) rule according to which modulation processing is performed by modulation section 15. This will be explained in detail later herein.

A transmit symbol S3 obtained by modulation section 15 is input to a radio section 16. Radio section 16 performs predetermined radio processing such as digital/analog conversion and up-conversion on modulated symbol S3, and supplies an obtained RF signal S4 to an antenna 17.

Figure 3:
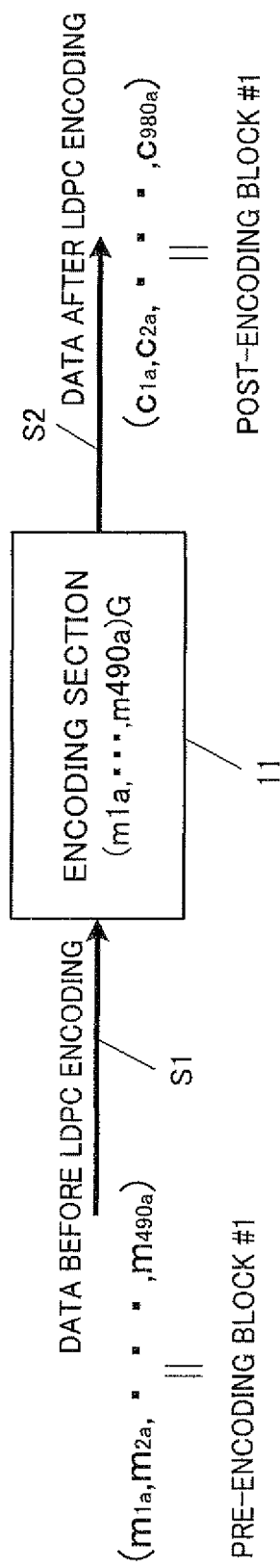
FIG. 3 is a drawing provided to explain LDPC encoding processing by an encoding section.

LDPC code generation processing by encoding section 11 of this embodiment will now be described using FIG. 3. Encoding section (LDPC encoder) 11 has transmit data S1 (that is, data before LDPC encoding) as input, and outputs block encoded data S2 (that is, data after LDPC encoding) by performing LDPC encoding on transmit data S1. For example, if data before LDPC encoding is designated (m1$a$, m2$a$, ... m490$a$), and the parity check matrix is designated G, (C1$a$, C2$a$, ... C980$a$) is output as data after LDPC encoding.

That is to say, post-encoding block #1 composed of 980 bits is formed from pre-encoding block #1 composed of 490 bits.

Figure 4A:
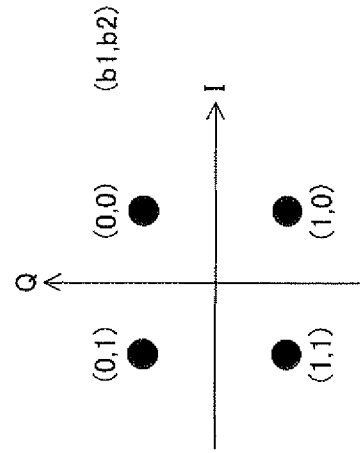
FIG. 4A is a drawing showing BPSK signal point arrangement.
Figure 4B:
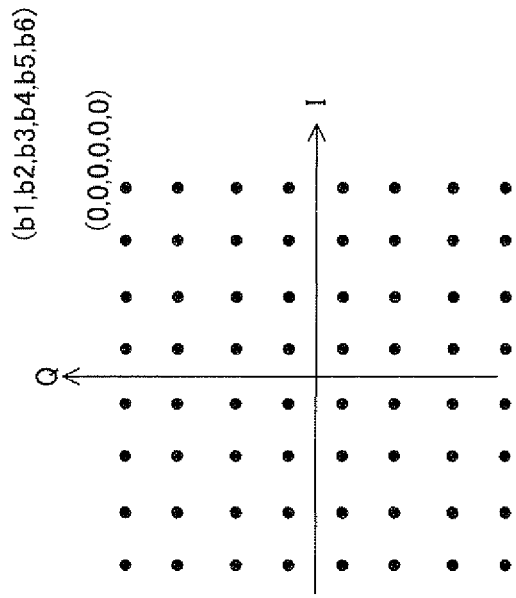
FIG. 4B is a drawing showing QPSK signal point arrangement.
Figure 4C:
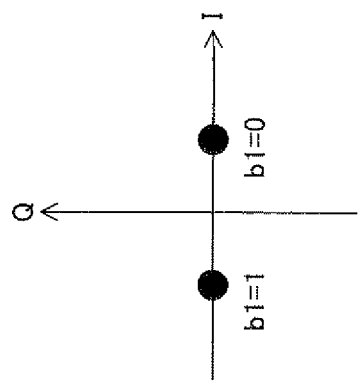
FIG. 4C is a drawing showing 16QAM signal point arrangement.
Figure 4D:
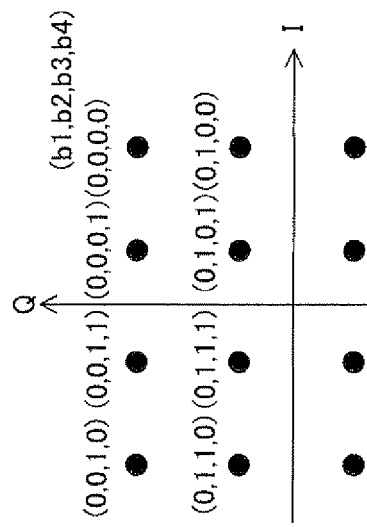
FIG. 4D is a drawing showing 64QAM signal point arrangement.

Modulation processing by modulation section 15 will now be described using FIG. 4. As this modulation processing is a known technology, it will be described briefly. FIG. 4A shows a BPSK signal point arrangement, with one bit—that is, b1—transmitted in one symbol. FIG. 4B shows a QPSK signal point arrangement, with two bits—that is, (b1, b2)—transmitted in one symbol. FIG. 4C shows a 16QAM signal point arrangement, with four bits—that is, (b1, b2, b3, b4)—transmitted in one symbol. FIG. 4D shows a 64QAM signal point arrangement, with six bits—that is, (b1, b2, b3, b4, b5, b6) transmitted in one symbol.

Arrangement (interleaving) processing by arranging (interleaving) section 12, which is a characteristic of this embodiment, will now be described using FIG. 5 through FIG. 8. FIG. 5 through FIG. 8 show which post-modulation symbols bits in each LDPC encoded block are assigned to. Specifically, these drawings show the symbols in which encoded data in one block (data after LDPC encoding) composed of 980 bits are placed. The horizontal axis indicates the symbol time sequence, and the vertical axis indicates the bit numbers composing one symbol—that is, b1 in the case of BPSK; b1 and b2 in the case of QPSK; b1, b2, b3, and b4 in the case of 1.6QAM; and b1, b2, b3, b4, b5, and b6 in the case of 64QAM.

In these drawings, #X-Y indicates the Y'th bit (bit number Y among 980 bits) of the X'th encoded block. For example, #1-1 indicates the 1st bit of the 1st encoded block. Similarly, #3-979 indicates the 979th bit of the 3rd encoded block.

FIG. 5A shows bit assignment to each symbol when the modulation method is BPSK. When the modulation method is BPSK, one bit (b1) is transmitted in one symbol, and therefore only one 980-bit encoded block is transmitted by means of 980 symbols.

FIG. 5B shows bit assignment to each symbol when the modulation method is QPSK. When the modulation method is QPSK, two bits (b1, b2) are transmitted in one symbol, and therefore two 980-bit post-encoding blocks are transmitted by means of 980 symbols. As is clear from the drawing, each symbol here is composed by collecting together intra-block encoded data of different encoded blocks. Specifically, hits #1-1 through #1-980 of post-encoding block #1 are assigned to hit b1 of the 980 QPSK symbols, and bits #2-1 through #2-980 of post-encoding block #2 are assigned to bit b2 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, error rate performance can be improved.

FIG. 5C shows bit assignment to each symbol when the modulation method is 16QAM. When the modulation method is 16QAM, four bits (b1, b2, b3, b4) are transmitted in one symbol, and therefore four 980-bit post-encoding blocks are transmitted by means of 980 symbols. A characteristic of bit assignment to each symbol here is that, as with QPSK, encoded data in one block is assigned to a plurality of symbols. Specifically, data 41-1 through #1-980 of post-encoding block #1 are assigned to bit b1 of the 980 16QAM symbols, data #2-1 through #2-980 of post-encoding block 42 are assigned to bit b2 of the 980 symbols, data #3-1 through #3-980 of post-encoding block #3 are assigned to bit b3 of the 980 symbols, and data #4-1 through #4-980 of post-encoding block #4 are assigned to bit b4 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, error rate performance can be improved.

FIG. 5D shows bit assignment to each symbol when the modulation method is 64QAM. When the modulation method is 64QAM, six bits (b1, b2, b3, b4, b5, b6) are transmitted in one symbol, and therefore six 980-bit post-encoding blocks are transmitted by means of 980 symbols. A characteristic of bit assignment to each symbol here is that, as with QPSK and 16QAM, encoded data in one block is assigned to a plurality of symbols. Specifically, data #1-1 through #1-980 of post-encoding block #1 are assigned to bit H of the 980 64QAM symbols, data 42-1 through #2-980 of post-encoding block #2 are assigned to bit b2 of the 980 symbols, data 43-1" through #3-980 of post-encoding block #3 are assigned to bit b3 of the 980 symbols, data #4-1 through #4-980 of post-encoding block #4 are assigned to bit b4 of the 980 symbols, data #5-1 through #5-980 of post-encoding block #5 are assigned to bit b5 of the 980 symbols, and data #6-1 through #6-980 of post-encoding block #6 are assigned to bit b6 of the 980 symbols.

By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, error rate performance can be improved.

Second examples of arrangement (interleaving) processing of arranging (interleaving) section 12 of this embodiment will now be described using FIG. 6. The examples shown in FIG. 6 are similar to those in FIG. 5 in that encoded data in one block is assigned to a plurality of symbols, and the same kind of effect can be obtained as when arrangement (interleaving) is performed as shown in FIG. 5. FIG. 6 differs from FIG. 5 in that, with QPSK, 16QAM, and 64QAM, one post-encoding block is not assigned to a fixed bit (for example, b1 only), but is assigned to all bits (for example, in the case of 16QAM, to b1, b2, b3, and b4). Specifically, when the modulation method is 16QAM, for example, a characteristic in this case is that block #1 is transmitted using b1, b2, b3, and b4, so that, for post-encoding block #1, data 41-1 is assigned to bit b1, #1-2 to b2, #1-3 to b3, and #1-4 to b4.

The reason for using this kind of assignment method will now be explained. There are differences in 16QAM b1 reception quality, b2 reception quality, b3 reception quality, and b4 reception quality. Assume that b1 reception quality is the poorest. In this case, if block #1 is transmitted using only b1, block #1 will be the block with the poorest reception quality. When packet communication is performed, packet errors are affected by the reception quality of the block with the poorest reception quality. Therefore, in this case, reception quality should be made uniform for blocks #1 through #4. Also, preferably, the number of times assignment is performed to b1, b2, b3, and b4 should be made as uniform as possible for blocks #1 through #4. The difference in the number of times assignment is performed should preferably be once at most. Since the number of symbols is not necessarily a multiple of 4 (bits) (the number of bits that can be transmitted in one symbol in 16QAM), a difference of one time may occur however assignment is performed.

Here, a case in which 16QAM is used has been described by way of example, but the same kind of effect can also be obtained when the same kind of processing is performed with 64QAM. However, the same kind of effect cannot necessarily be obtained in the case of QPSK since there is no difference in reception quality between b1 and b2. Nevertheless, since the possibility of a difference in reception quality arising due to distortion caused by the transmitting apparatus and receiving apparatus cannot be denied, there is a possibility of such an effect being obtained.

Third examples of arrangement (interleaving) processing of arranging (interleaving) section 12 of this embodiment will now be described using FIG. 7. The examples shown in FIG. 7 are similar to those in FIG. 5 in that encoded data in one block is assigned to a plurality of symbols, and the same kind of effect can be obtained as when arrangement (interleaving) is performed as shown in FIG. 5. FIG. 7 differs from FIG. 5 in that, while the same block data is transmitted by the same symbols, the order of transmission is block #1 data and block #2 data blocks alternately for QPSK; block #1, block #2, block #3 in that order for 16QAM; and block #1, block #2, block #3, block #4, block #5, block #6 in that order for 64QAM. That is to say, block data may be assigned to symbols at intervals instead of being assigned to successive symbols as in FIG. 5. However, the kind of assignment methods shown in FIG. 5 and FIG. 6 enable intra-block data to be dispersed among more symbols, and are therefore more effective in improving reception quality.

Fourth examples of arrangement (interleaving) processing of arranging (interleaving) section 12 of this embodiment will now be described using FIG. 8. The examples shown in FIG. 8 are similar to those in FIG. 5 in that encoded data in one block is assigned to a plurality of symbols, and the same kind of effect can be obtained as when arrangement (interleaving) is performed as shown in FIG. 5. The examples in FIG. 8 combine the concepts illustrated in FIG. 6 and FIG. 7. In FIG. 8, symbols to which assignment is performed are changed in 2-bit units. By this means, the same kind of effect can be obtained as in FIG. 5 and FIG. 6, but the kind of assignment methods shown in FIG. 5 and FIG. 6 enable intra-block data to be dispersed among more symbols, and are therefore more effective in improving reception quality.

Thus, according to this embodiment, by providing an encoding section 11 that executes block encoding processing on transmit data and forms block encoded data, a modulation section 15 that modulates block encoded data and forms data symbols, and an arranging (interleaving) section 12 that arranges (interleaves) block encoded data so that one data symbol is composed by collecting together intra-block data of different encoded blocks, and supplies the arranged (interleaved) block encoded data to modulation section 15, a transmitting apparatus 10 can be implemented that enables burst errors to be suppressed with a comparatively simple configuration without changing the block size of an encoded block even when the number of modulation multi-values is increased.

The processing of arranging (interleaving) section 12 can be said to be arranging (interleaving) block encoded data so that one symbol is composed by collecting together block encoded data of more encoded blocks as the number of modulation multi-values of modulation section 15 increases.

Embodiment 2

Figure 9:
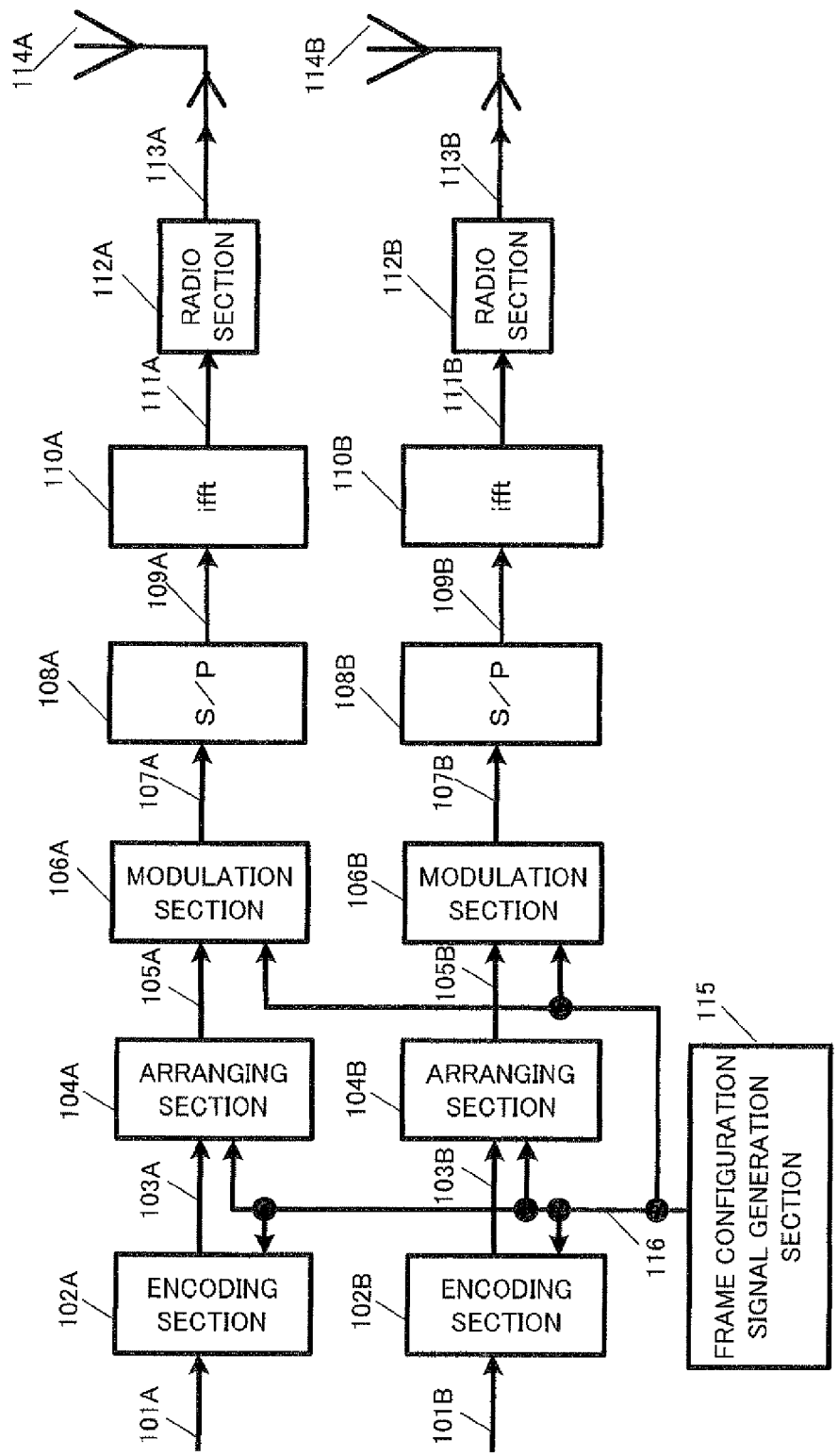
FIG. 9 is a block diagram showing the configuration of a multi-antenna transmitting apparatus of Embodiment 2.

FIG. 9 shows the configuration of a multi-antenna transmitting apparatus of Embodiment 2 of the present invention.

Multi-antenna transmitting apparatus 100 is a transmitting apparatus that performs so-called OFDM-MIMO communication, and transmits different modulated signals from two antennas. Specifically, multi-antenna transmitting apparatus 100 transmits a modulated signal A from an antenna 114A and transmits a modulated signal B from an antenna 114B. In FIG. 9, virtually the same configuration is used for the signal processing system for modulated signal A and the signal processing system for modulated signal B, and therefore "A" is appended to reference codes for the modulated signal A signal processing system, and "B" is appended to reference codes for the corresponding modulated signal B signal processing system.

A frame configuration signal generation section 115 of multi-antenna transmitting apparatus 100 outputs a control signal 116 with frame configuration related information, encoding method information, modulation method information, and so forth. An encoding section 102A has modulated signal A data 101A and control signal 116 as input, executes encoding based on control signal 116, and outputs post-encoding data 103A.

An arranging (interleaving) section 104A has post-encoding data 103A and control signal 116 as input, arranges (interleaves) post-encoding data 103A based on control signal 116, and outputs post-arrangement (interleaving) data 105A.

A modulation section 106A has post-arrangement (interleaving) data 105A and control signal 116 as input, executes BPSK, QPSK, 16QAM, or 64QAM modulation based on control signal 116, and outputs a baseband signal 107A.

A serial/parallel conversion section (SIP) 108A has baseband signal 107A as input, executes serial/parallel conversion, and outputs a parallel signal 109A. An inverse Fourier transform section (ifft) 110A has parallel signal 109A as input, executes a Fourier transform, and outputs a post-Fourier-transform signal 111A that is, an OFDM signal. A radio section 112A has post-Fourier-transform signal 111A as input, and forms a, modulated signal A transmit signal 113A by executing predetermined radio processing such as frequency conversion and amplification. Transmit signal 113A is output as a radio wave from antenna 114A.

The same kind of processing is also executed for modulated signal B by means of an encoding section 102B, arranging (interleaving) section 104B, modulation section 106B, serial/parallel conversion section (S/P) 108B, inverse Fourier transform section (ifft) 110B, and radio section 112B, and a modulated signal B transmit signal 113B is transmitted as a radio wave from antenna 114B.

Figure 10A:
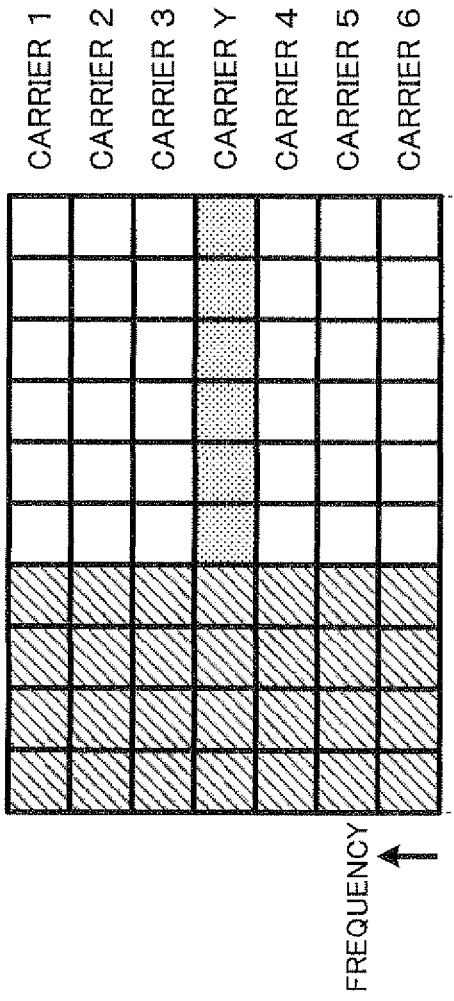
FIG. 10 is a drawing showing an example of the frame configurations of transmit signals of transmit signals transmitted from each antenna of a multi-antenna transmitting apparatus.
Figure 10B:
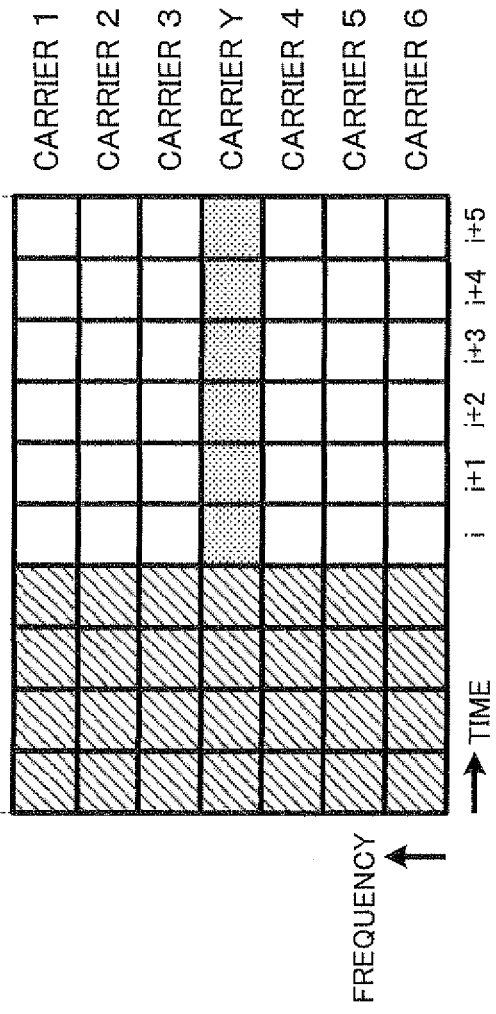

FIG. 10 shows an example of the frame configurations of transmit signals of modulated signal A and modulated signal B transmitted from antennas 114A and 114B of multi-antenna transmitting apparatus 100. FIG. 10A shows a frame configuration of modulated signal A transmitted from antenna 114A, and FIG. 10B shows a frame configuration of modulated signal B transmitted from antenna 114B. In this embodiment, spatial multiplexing MIMO (Multiple-Input Multiple-Output) transmission is used as the communication method, and therefore modulated signal A and modulated signal B symbols of the same carrier and the same time are transmitted simultaneously from different antennas, and multiplexed spatially.

The preamble placed at the head of a frame is for estimating channel fluctuation. A receiver estimates channel fluctuation using the preamble, and can separate modulated signal A and modulated signal B using ZF (Zero Forcing) or MMSE (Minimum Mean Square Error) processing.

Pilot symbols placed in the time direction of carrier Y are symbols used by a receiving apparatus to estimate and eliminate frequency offset that cannot be eliminated by means of the preamble and distortion (amplitude/phase) due to device characteristics.

Data symbols are symbols for transmitting data, and are transmitted after the preamble.

Figure 11:
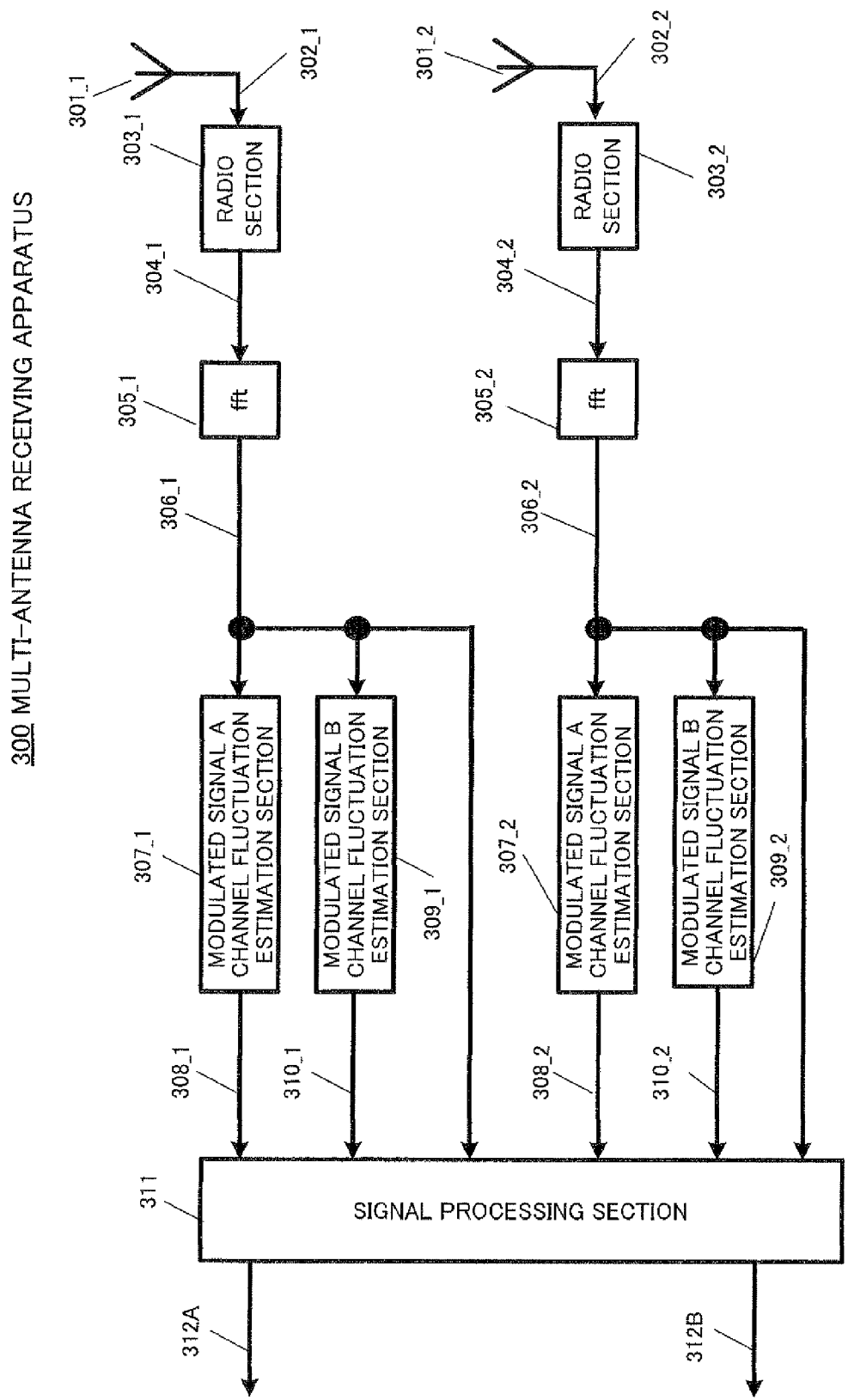
FIG. 11 is a block diagram showing the configuration of a multi-antenna receiving apparatus of Embodiment 2.

FIG. 11 shows the configuration of a multi-antenna receiving apparatus that receives and demodulates a signal transmitted from multi-antenna transmitting apparatus 100.

A radio section 303_1 of a multi-antenna receiving apparatus 300 has a received signal 302_1 received by an antenna 301_1 as input, executes amplification, frequency conversion, and so forth, and outputs a baseband signal 304_1. A Fourier transform section (fft) 305_1 has baseband signal 304_1 as input, executes a Fourier transform, and outputs a post-Fourier-transform signal 306_1.

A modulated signal A channel fluctuation estimation section 307_1 has post-Fourier-transform signal 306_1 as input, extracts the modulated signal A preamble shown in FIG. 10A, estimates modulated signal A channel fluctuation based on this preamble, and outputs a modulated signal A channel fluctuation estimation signal 308_1.

A modulated signal B channel fluctuation estimation section 309_1 has post-Fourier-transform signal 306_1 as input, extracts the modulated signal B preamble shown in FIG. 10B, estimates modulated signal B channel fluctuation based on this preamble, and outputs a modulated signal B channel fluctuation estimation signal 310_1.

A radio section 303_2, Fourier transform section 305_2, modulated signal A channel fluctuation estimation section 307_2, and modulated signal B channel fluctuation estimation section 309_2 operate in the same way as described above.

A signal processing section 311 has post-Fourier-transform signals 306_1 and 306_2, modulated signal A channel fluctuation estimation signals 308_1 and 308_2, and modulated signal B channel fluctuation estimation signals 310_1 and 310_2 as input, and obtains modulated signal A receive data 312A and modulated signal B receive data 312B by performing ZF (Zero Forcing), MMSE (Minimum Mean Square Error), or suchlike processing, and also performing decoding. The operation of signal processing section 311 will be described in detail later herein using FIG. 13.

Figure 12:
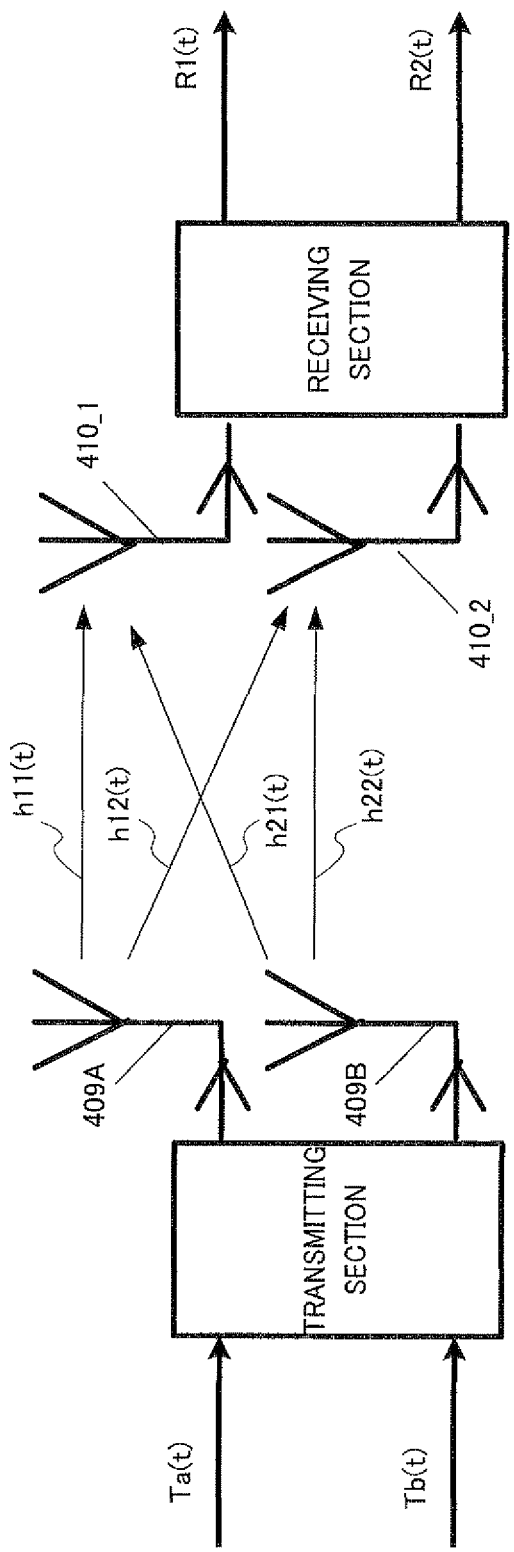
FIG. 12 is a drawing showing a model of communication between a multi-antenna transmitting apparatus and a multi-antenna receiving apparatus.

FIG. 12 shows a model of communication between a multi-antenna transmitting apparatus and a multi-antenna receiving apparatus. Here, a modulated signal transmitted from an antenna 409A is designated Txa(t), and a modulated signal transmitted from an antenna 409B is designated Txb(t) (t: time). Also, if channel fluctuations between the respective transmitting and receiving antennas are designated $h11(t)$, $h12(t)$, $h21(t)$, and $h22(t)$, a received signal received by an antenna 401_1 is designated Rx1(t), and a received signal received by an antenna 401_2 is designated Rx2(t), the following relational expression holds true.

$$\begin{pmatrix} Rx1(t) \\ Rx2(t) \end{pmatrix} = \begin{pmatrix} h11(t) & h21(t) \\ h12(t) & h22(t) \end{pmatrix} \begin{pmatrix} Txa(t) \\ Txb(t) \end{pmatrix} \quad (1)$$

Figure 13:
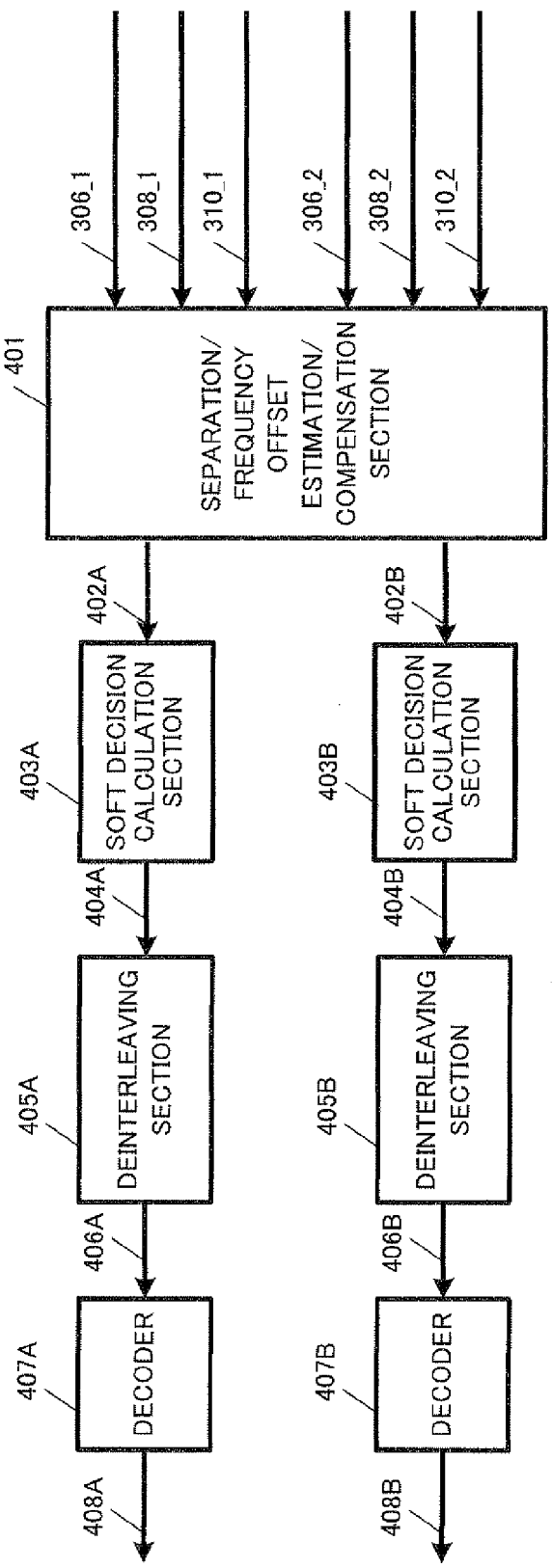
FIG. 13 is a block diagram showing the configuration of the signal processing section of a multi-antenna receiving apparatus.

FIG. 13 shows the configuration of signal processing section 311 of multi-antenna receiving apparatus 300. A separation/frequency offset estimation/compensation section 401 has post-Fourier-transform signals 306_1 and 306_2, modulated signal A channel fluctuation estimation signals 308_1 and 308_2, and modulated signal B channel fluctuation estimation signals 310_1 and 310_2 as input, and separates modulated signal A and modulated signal B by performing Equation (1) inverse matrix computation (ZF). Also, separation/frequency offset estimation/compensation section 401 estimates frequency offset and distortion (amplitude/phase)

due to device performance using the pilot symbols shown in FIG. 10, compensates for these based on the estimation results, and obtains a modulated signal A post-compensation baseband signal 402A and a modulated signal B post-compensation baseband signal 402B.

A soft decision calculation section 403A has modulated signal A post-compensation baseband signal 402A as input, and obtains a soft decision value 404A by calculating a branch metric. A deinterleaving section 405A has soft decision value 404A as input, and obtains a post-deinterleaving soft decision value 406A by performing deinterleaving (the reverse of the processing performed by arranging (interleaving) section 104A). A decoder 407A has post-deinterleaving soft decision value 406A as input, and obtains modulated signal A receive data 408A by decoding this post-deinterleaving soft decision value 406A.

A soft decision calculation section 403B, deinterleaving section 405B, and decoder 407B perform the same kind of operations as described above, and obtain modulated signal B receive data 408B.

Figure 14:
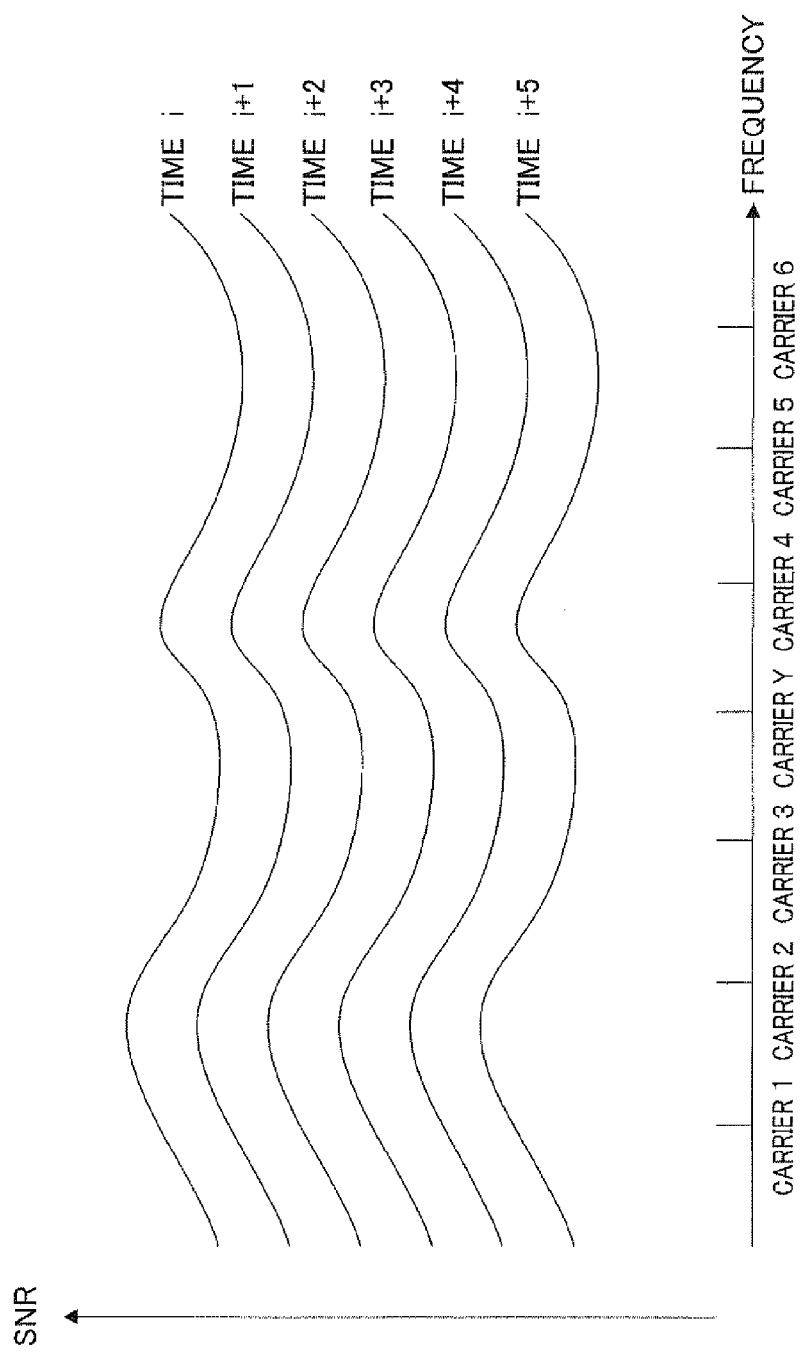
FIG. 14 is a drawing showing the relationship between the SNR characteristics of a signal at different points in time in a receiving apparatus.

FIG. 14 shows an example of the relationship between the signal to noise power ratios (SNRs) of carriers 1 through 6 at times i+1, i+2, i+3, i+4, and i+5, obtained in a receiving apparatus. As shown in FIG. 14, the SNR of a data symbol falls with temporal distance from the preamble. This is because the frequency estimation error and the estimation error of distortion (amplitude/phase) due to device characteristics in the receiving apparatus increase with temporal distance from the preamble.

Figure 28:
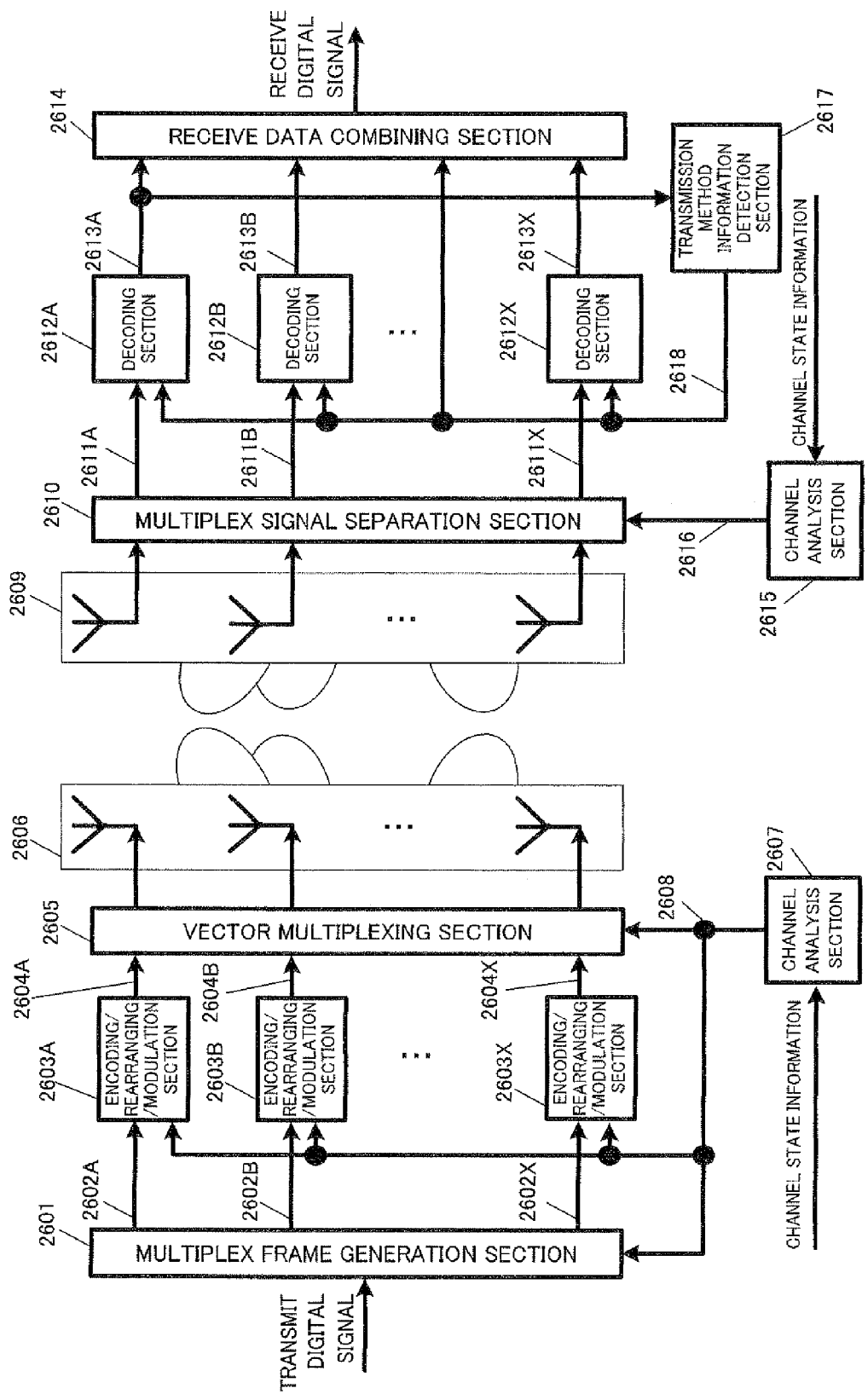
FIG. 28 is a block diagram showing configuration examples when the present invention is applied to a system that uses an eigenmode.

When interleaving is performed within one OFDM symbol and deinterleaving is performed by the receiving apparatus, as in FIG. 28 for example, data belonging to an OFDM symbol temporally distant from the preamble, such as at times i+4 and i+5, is composed of only data symbols with a degraded SNR in consideration of the phenomenon in FIG. 14, even though interleaving is executed, and therefore it is difficult to obtain coding gain even though error correction is performed, and error rate performance degrade.

In a conventional system in which the transmitting and receiving apparatuses each have only one antenna, this problem can be solved very easily. It is only necessary to insert symbols for frequency offset and distortion estimation, such as pilot symbols for example. In this case, pilot symbols need not be inserted so frequently, and therefore the drop in transmission speed due to pilot symbol insertion is small, and pilot symbol insertion is not such a major disadvantage for the system.

On the other hand, in a multi-antenna system such as a MIMO system that uses spatial multiplexing, separation symbols (comprising the preamble in FIG. 10) for separating modulated signals mixed on the transmission path are essential. Also, channel fluctuations h11 through h22 are estimated using these separation symbols, and causes of degradation of the estimation precision of channel fluctuations h11 through h22 include temporal fluctuation of frequency offset and distortion. However, the above-described, drop in SNR cannot be prevented simply by inserting pilot symbols and estimating temporal fluctuation of frequency offset and distortion estimation. In the final analysis, the above-described drop in SNR cannot be prevented unless the estimation precision of channel fluctuations h11 through h22 is ensured. A possible method of achieving this is to increase the frequency of separation symbol insertion. That is to say, a solution is difficult even if the frequency of pilot symbol insertion is increased. However, since it is necessary for separation symbols to be placed in all carriers, there is a problem of transmission speed falling significantly if the frequency of separation symbol insertion is increased. It is therefore important to improve the SNR while keeping the frequency of separation symbol insertion as low as possible.

In this embodiment, a multi-antenna transmitting apparatus is proposed that enables degradation of the error rate performance of data placed in a symbol distant from the preamble to be suppressed without increasing the frequency of preamble insertion.

In this embodiment, the above-described problem is solved by a contrivance of the arrangement (interleaving) processing of arranging (interleaving) sections 104A and 104B provided between encoding sections 102A and 102B and modulation sections 106A and 106B. This will now be explained in detail.

Here, arranging (interleaving) sections 104A and 104B perform arrangement (interleaving) so that input m'th data is placed in a data symbol at the carrier p(m) position on the frequency axis, and in a data symbol at the time q(m) position on the time axis. This arrangement (interleaving) processing is expressed as $\pi(m)=(p(m),q(m))$.

Figure 15:
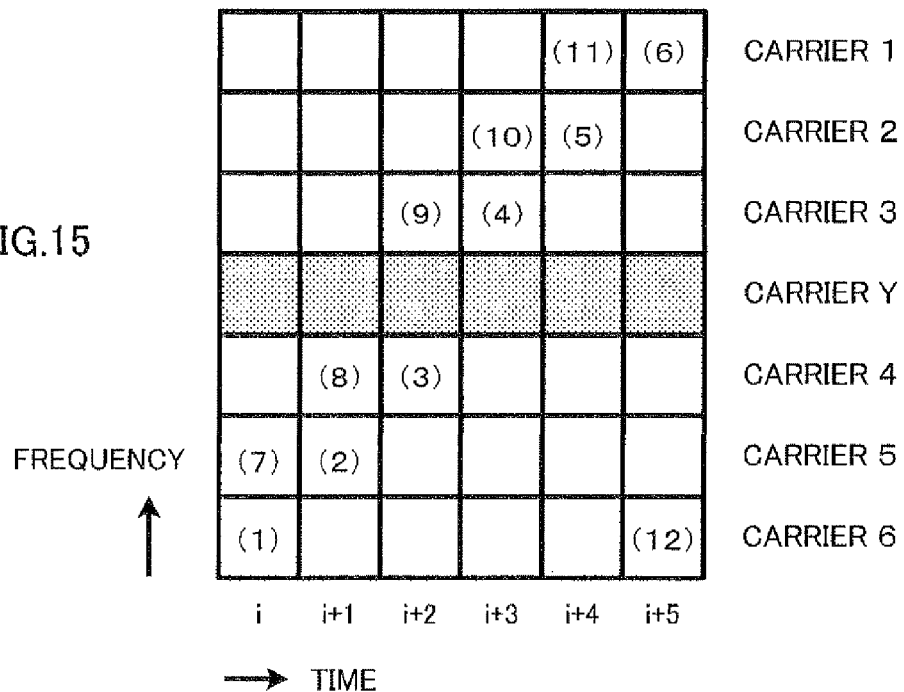
FIG. 15 is a drawing showing an example of arrangement (interleaving) processing of data after encoding.
Figure 16:
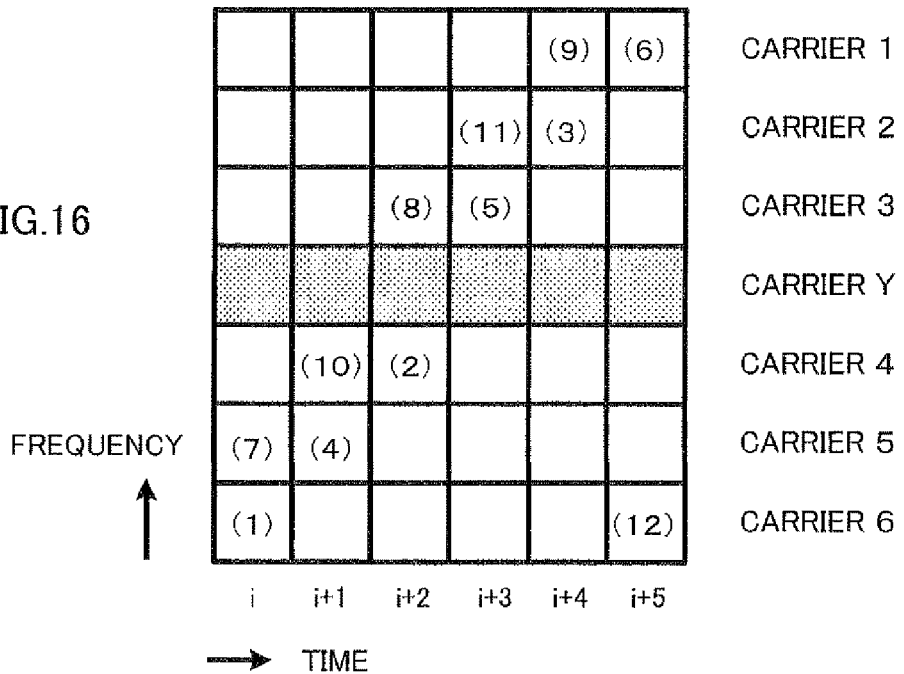
FIG. 16 is a drawing showing an example of arrangement (interleaving) processing of data after encoding.

FIG. 15 and FIG. 16 show examples of arrangement (interleaving) processing of data after encoding by arranging (interleaving) sections 104A and 104B. By way of illustration, FIG. 15 and FIG. 16 show examples in which data arrangement (interleaving) is performed within six OFDM symbols. The preambles are omitted. In FIG. 15 and FIG. 16, (1), (2), (3), . . . indicate the order of data placement, meaning, for example, that the data input first is placed in data symbol (1), and the data input second is placed in data symbol (2).

The important point in the arrangement (interleaving) shown in FIG. 15 and FIG. 16 is that the 1st data and 2nd data are placed in data symbol positions of different times. For example, when encoding sections 102A and 102B execute block encoding processing for a block size of 6, arranging (interleaving) sections 104A and 104B assign the six data items in an encoded block to symbols at temporally different positions. Thus, for example, data after block encoding is assigned to symbols so that $q(1){\neq}q(2){\neq}q(3){\neq}q(4){\neq}q(5){\neq}q(6)$ and $q(7){\neq}q(8){\neq}q(9){\neq}q(10){\neq}q(11){\neq}q(12)$.

By this means, it no longer happens that data with a degraded SNR are positioned consecutively in a data sequence on which the receiving apparatus has performed deinterleaving, and therefore coding gain can be obtained by performing error correction, and degradation of error rate performance can be suppressed.

Taking SNR correlativity in the frequency axis direction into consideration (SNR correlativity being higher between close carriers), degradation of error rate performance can be further suppressed by arranging (interleaving) encoded data so that, in addition to the above conditions, $p(1){\neq}p(2){\neq}p(3){\neq}p(4){\neq}p(5){\neq}p(6)$ and $p(7){\neq}p(8){\neq}p(9){\neq}p(10){\neq}p(11){\neq}p(12)$.

Thus, according to this embodiment, by providing arranging (interleaving) sections 104A and 104B that arrange (interleave) encoded data so that encoded data within the same encoded block is assigned to a plurality of data symbols in the time direction, it is possible to prevent all data within an encoded block from being assigned to data symbols at positions distant from the preamble. In other words, distances from the preamble can be made virtually uniform among encoded blocks, making it possible to implement a multi-antenna transmitting apparatus 100 that enables degradation of error rate performance due to distance from the preamble to be suppressed. In addition, the influence of notches due to fading can also be reduced.

In the description of this embodiment, a frame configuration composed of only a preamble, data symbols, and pilot symbols, such as shown in FIG. 10, has been taken as an example, but the frame configuration is not limited to this case, and symbols that transmit control information, for example, may also be included. In short, this embodiment is suitable for application to a wide range of cases in which data symbols are preceded by a preamble.

In the configuration example in FIG. 9, a configuration is illustrated in which encoding sections 102A and 102B are provided respectively for modulated signals A and B, but this embodiment can also be applied to a configuration in which encoding processing of both modulated signals A and B is performed by one encoding section.

Figure 17:
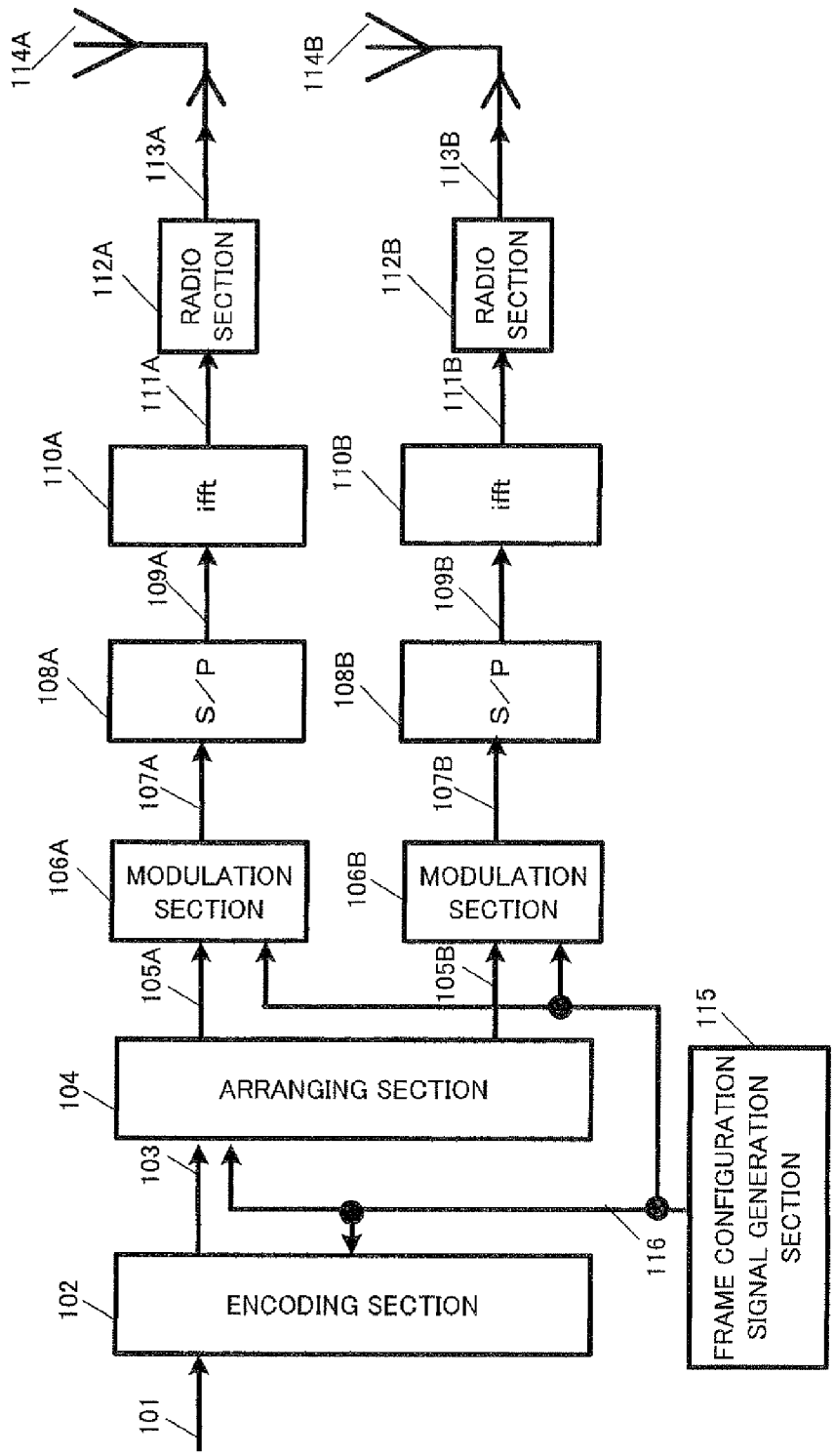
FIG. 17 is a block diagram showing another example of the configuration of a multi-antenna transmitting apparatus of Embodiment 2.

FIG. 17 shows an example of such a configuration. In FIG. 17, in which parts corresponding to those in FIG. 9 are assigned the same reference codes as in FIG. 9, encoding section 102 and arranging (interleaving) section 104 in multi-antenna transmitting apparatus 500 are the only points of difference from multi-antenna transmitting apparatus 100.

Encoding section 102 has data 101 and control signal 116 as input, executes encoding based on control signal 116, and outputs post-encoding data 103. Arranging (interleaving) section 104 has post-encoding data 103 and control signal 116 as input, arranges (interleaves) post-encoding data 103 based on frame configuration information contained in control signal 116, and supplies post-arrangement (interleaving) data 105A and 105B to modulation sections 106A and 106B respectively.

Figures 18A, 18B:
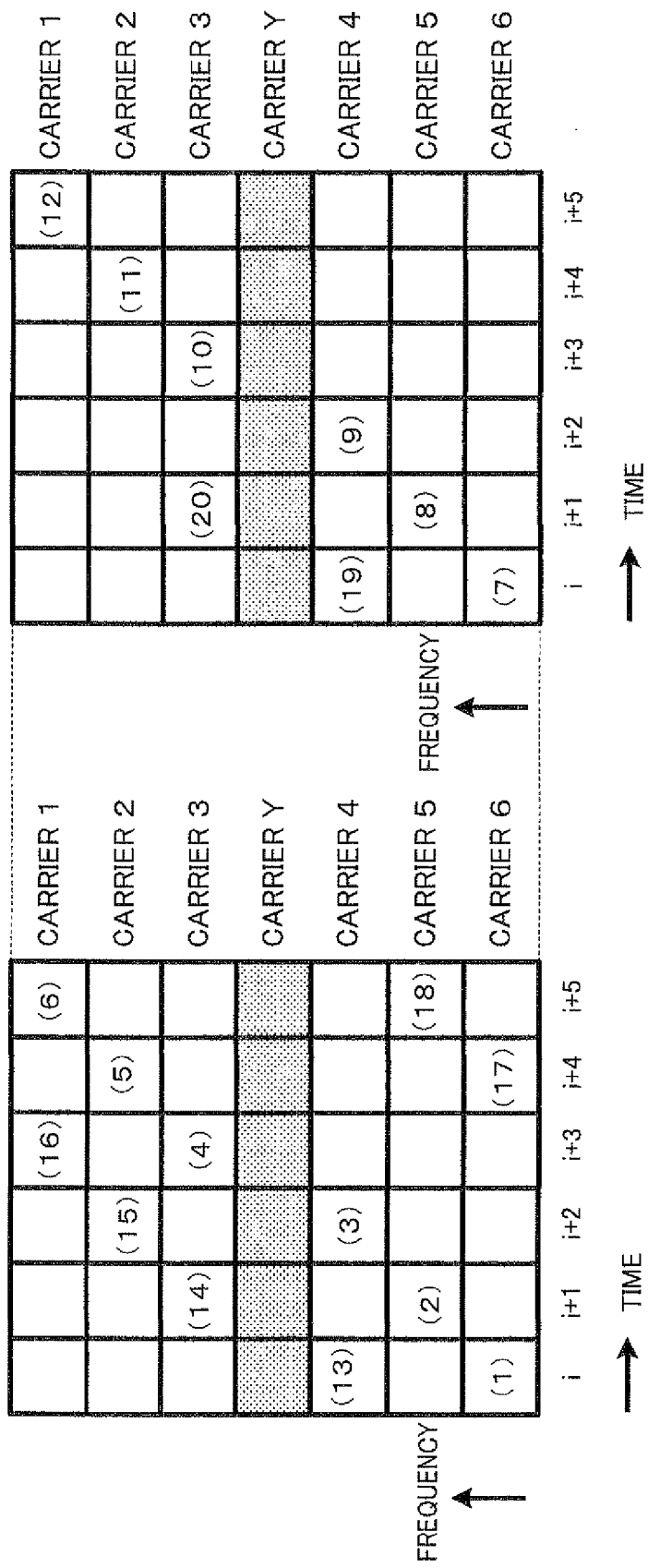
FIG. 18 is a drawing showing an example of arrangement (interleaving) processing of data after encoding.

FIG. 18, FIG. 19, and FIG. 20 show examples of arrangement (interleaving) processing of data after encoding by arranging (interleaving) section 104.

In FIG. 18, 6-bit data after encoding is first assigned to modulated signal A data symbols of different times (corresponding to (1), (2), (3), (4), (5), (6) in FIG. 18). Then 6-bit data after encoding is assigned to modulated signal B data symbols of different times (corresponding to (7), (8), (9), (10), (11), (12) in FIG. 18). Next, 6-bit data after encoding is assigned to modulated signal A. In this way, data after encoding is assigned to data symbols of different times, and is assigned alternately to modulated signal A and modulated signal B. By this means, not only can the same kind of effect be obtained as in the assignment examples shown in FIG. 15 and FIG. 16, but in addition, since assignment is performed to modulated signal A and modulated signal B alternately, a further effect can be achieved of being able to obtain spatial diversity gain.

In FIG. 19, data assignment is performed alternately to modulated signal A and modulated signal B. In this case, 6-bit data in which only odd-numbered items have been extracted, or 6-bit data in which only even-numbered items have been extracted, is placed in symbols of different times. This is clear if, for example, data symbols (1), (3), (5), (6), (9), (11) of modulated signal A are looked at. By this means, not only can the same kind of effect be obtained as in the assignment examples shown in FIG. 15 and FIG. 16, but in addition, since assignment is performed to modulated signal A and modulated signal B alternately, a further effect can be achieved of being able to obtain spatial diversity gain.

In FIG. 20, data is first assigned to modulated signal A, and then data is assigned to modulated signal B. These are then assigned to symbols of different times, taking 6 bits after encoding as a unit. By this means, the same kind of effect can be obtained as in the assignment examples shown in FIG. 15 and FIG. 16.

Figure 21:
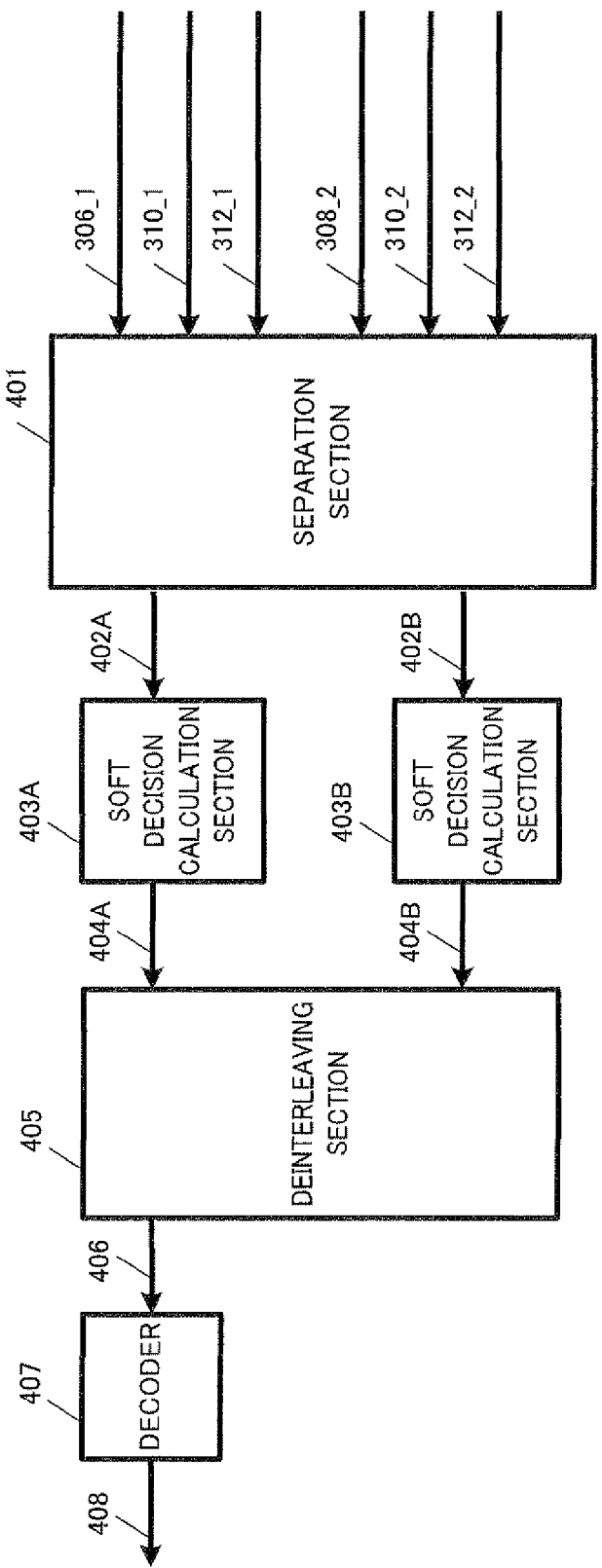
FIG. 21 is a block diagram showing the configuration of a signal processing section.

FIG. 21 shows the configuration of the signal processing section of a multi-antenna receiving apparatus that receives and demodulates signals transmitted from multi-antenna transmitting apparatus 500 configured as shown in FIG. 17. The overall configuration of the multi-antenna receiving apparatus here may be as shown in FIG. 11, and signal processing section 311 may be configured as shown in FIG. 21.

Signal processing section 311 in FIG. 21, in which parts corresponding to those in FIG. 13 are assigned the same reference codes as in FIG. 13, has a similar configuration to signal processing section 311 in FIG. 13, differing only in having only one deinterleaving section 405 and one decoder 407. Deinterleaving section 405 has modulated signal A soft decision value 404A and modulated signal B soft decision value 404B as input, performs deinterleaving according to the frame configuration (the reverse of the processing performed by arranging (interleaving) section 104 in FIG. 17), and obtains a post-deinterleaving soft decision value 406. Decoder 407 has post-deinterleaving soft decision value 406 as input, and obtains receive data 408 by decoding this post-deinterleaving soft decision value 406.

Embodiment 3

In this embodiment, an actual mode is described for a case in which LDPC encoding is performed by a multi-antenna transmitting apparatus. In addition, an actual mode is described for a case in which adaptive modulation is performed.

Figures 22A, 22B:
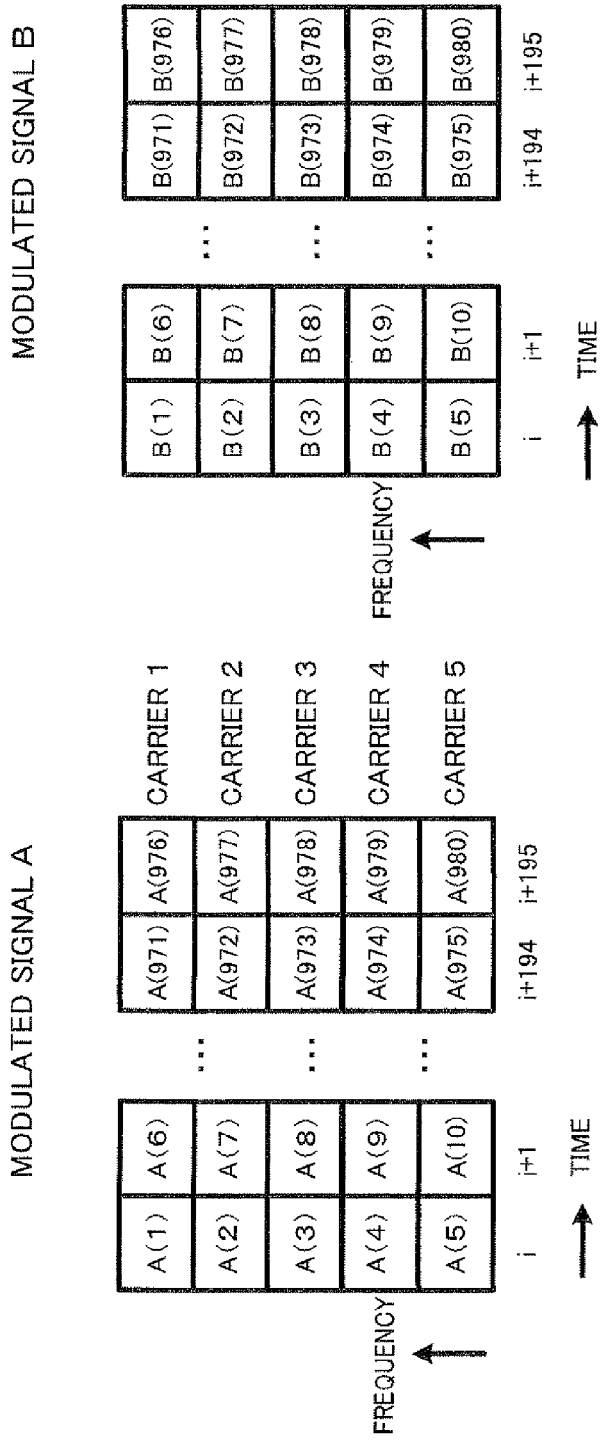
FIG. 22 is a drawing showing an example of arrangement (interleaving) processing of LDPC encoded data.

FIG. 22 is a drawing showing an example of assignment of post-encoding data to data symbols by arranging (interleaving) sections 104A and 104B when encoding sections 102A and 102B in FIG. 9 perform LDPC encoding with respective post-encoding block sizes of 980 bits. In this case, 980 bits in one encoded block are assigned to 980 modulated signal A symbols A(1), A(2), ..., A(980). Here, (1), (2), ..., (980) indicate the data order. Similarly, 980 bits in one encoded block are assigned to 980 modulated signal B symbols B(1), B(2), B(980). Thus, data (bits) in one encoded block are assigned to a plurality of data symbols. By this means, burst errors can be suppressed more effectively than when data in one encoded block is assigned to a small number of data symbols.

Figure 23B:
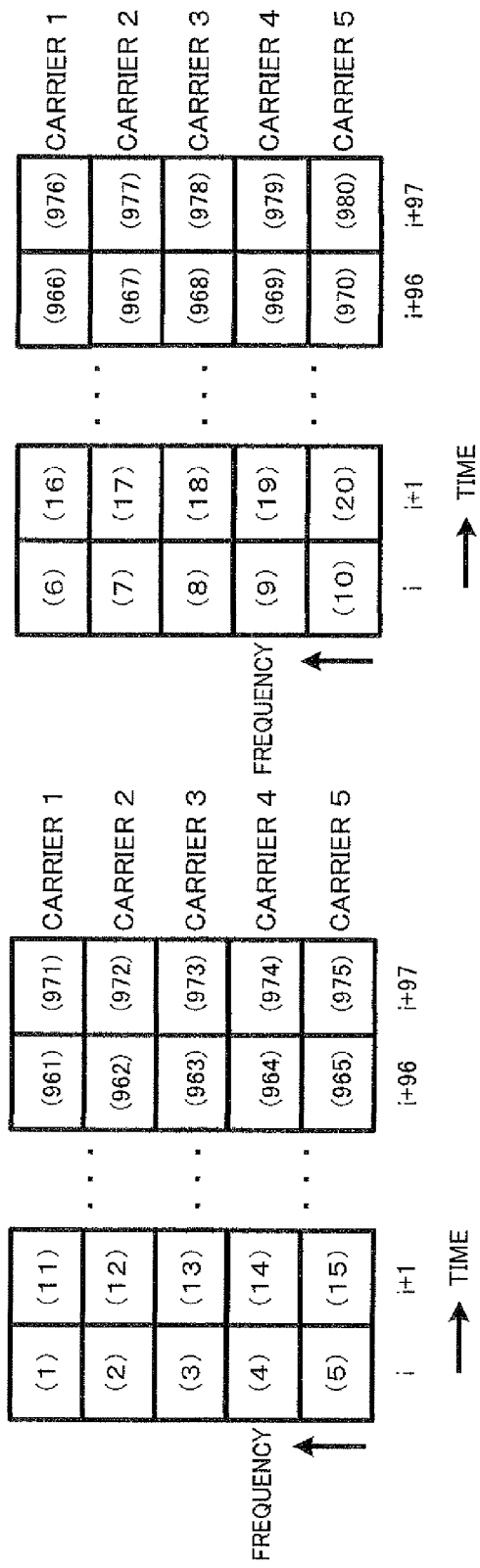
FIG. 23 is a drawing showing an example of arrangement (interleaving) processing of LDPC encoded data.
Figure 23A:
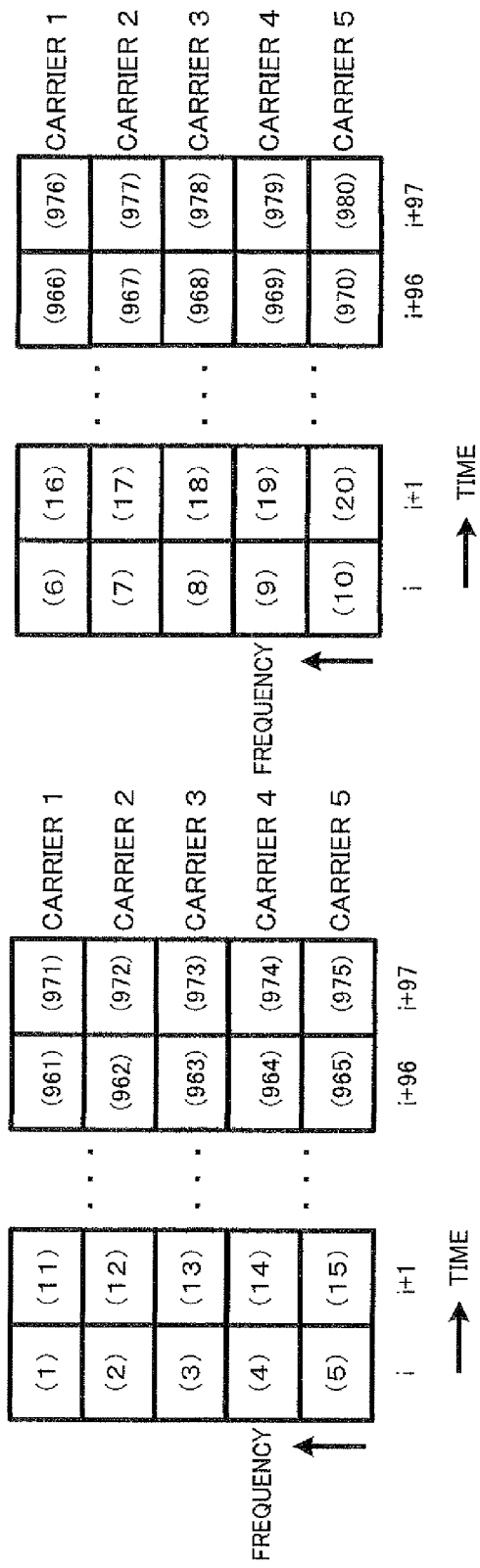

FIG. 23 is a drawing showing an example of assignment of post-encoding data to data symbols by arranging (interleaving) section 104 when encoding section 102 in FIG. 17 performs LDPC encoding with a block size of 980 bits. In this case, 980 bits in one encoded block are assigned to 980 modulated signal A and modulated signal B symbols. Here, (1), (2), (980) indicate the data order. By assigning data (bits) in one encoded block to a plurality of data symbols and a plurality of antennas in this way, burst errors can be suppressed more effectively than when data in one encoded block is assigned to a small number of data symbols, and a further effect can also be achieved of being able to obtain spatial diversity gain.

Next, a mode will be described for a case in which the present invention is applied to a multi-antenna transmitting apparatus that performs adaptive modulation (that is, switches the modulation method) according to the communication conditions.

Figure 24:
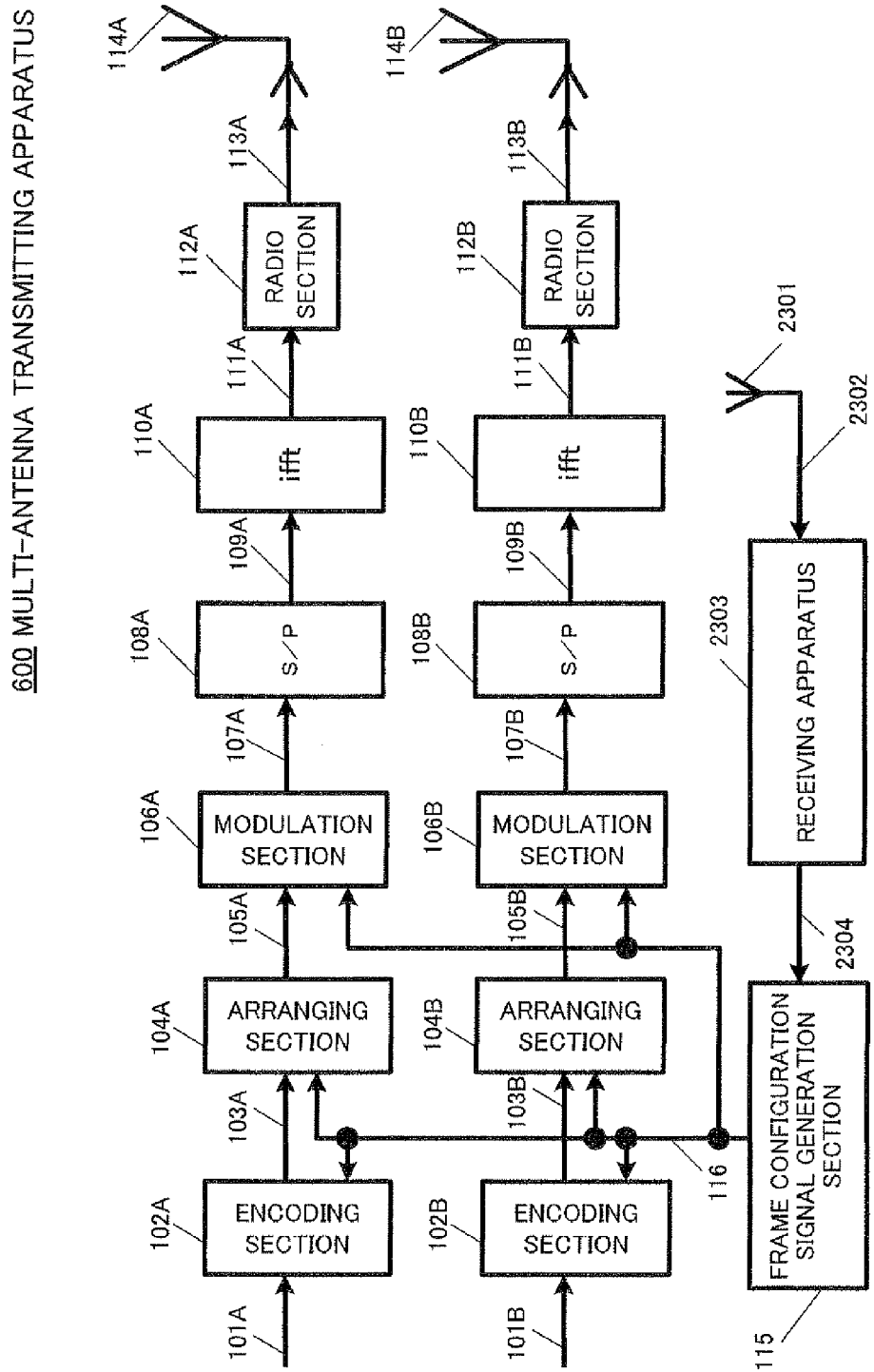
FIG. 24 is a block diagram showing the configuration of a multi-antenna transmitting apparatus that performs adaptive modulation.

FIG. 24 shows the configuration of a multi-antenna transmitting apparatus that performs adaptive modulation. Multi-antenna transmitting apparatus 600 in FIG. 24, in which parts corresponding to those in FIG. 9 are assigned the same reference codes as in FIG. 9, is provided in a base station, for example. A receiving apparatus 2303 has a received signal 2302 received by an antenna 2301 as input, performs reception processing and obtains communication condition information transmitted by a communicating-party terminal (for example, information such as the bit error rate, packet error rate, frame error rate, received signal strength, and multipath conditions), determines the modulation method therefrom, and outputs this as control information 2304. Frame configuration signal generation section 115 has control information 2304 as input, determines the modulation method and frame configuration based on control information 2304, and sends these to modulation sections 106A and 106B, encoding sections 102A and 102B, and arranging (interleaving) sections 104A and 104B as frame configuration signal 116.

Arranging (interleaving) sections 104A and 104B change their arrangement (interleaving) according to the modulation method in the same way as described in Embodiment 1.

Figure 25:
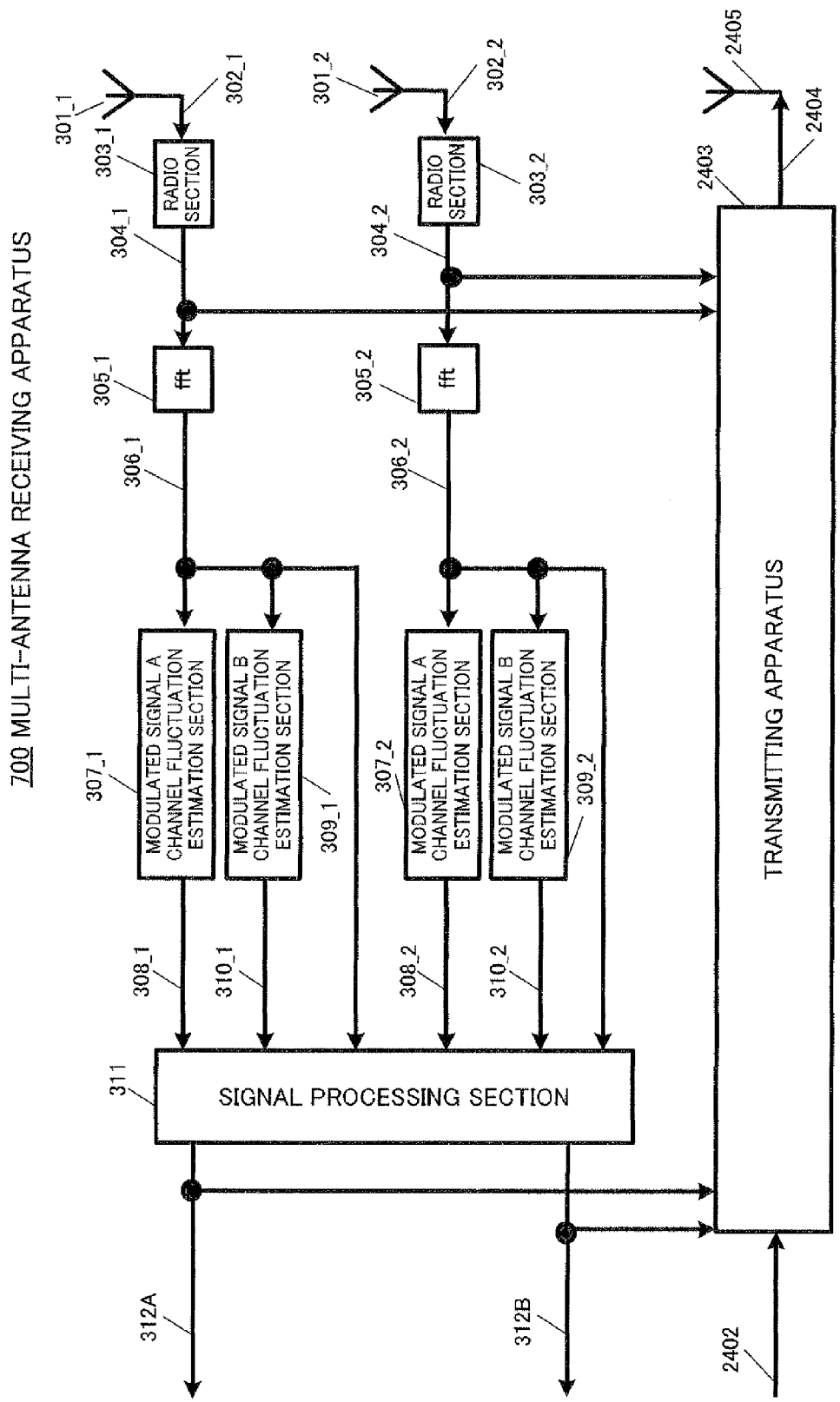
FIG. 25 is a block diagram showing the configuration of a multi-antenna receiving apparatus that receives an adaptive modulation signal.

FIG. 25 shows an example of the configuration of a communicating-party terminal that performs communication with multi-antenna transmitting apparatus 600. A transmitting apparatus 2403 of multi-antenna receiving apparatus 700 in FIG. 25, in which parts corresponding to those in FIG. 11 are assigned the same reference codes as in FIG. 11, has transmit data 2402, baseband signals 304_1 and 304_2, and receive data 312A and 312B as input, and, for example, estimates the received signal strength from baseband signals 304_1 and 304_2, finds the bit error rate, packet error rate, and frame error rate from receive data 312A and 312B, forms a transmit signal 2404 containing these items of information and transmit data, and outputs this as a radio wave from an antenna 2405. By this means, the modulation method of the base station (multi-antenna transmitting apparatus 600) is changed.

The method of changing the modulation method is not limited to this, and a similar effect can be achieved by having a communicating-party terminal specify a desired modulation method, or having the base station receive a modulated signal transmitted from a communicating-party terminal, and determine the modulation method of a modulated signal to be transmitted based on the reception status of the received signal.

Embodiment 4

In this embodiment, a contrivance of the assignment method of last block data after LDPC encoding will be described. In FIG. 26, the vertical axis indicates frequency, with data being transmitted using carriers 1 through n, and the horizontal axis indicates time.

In FIG. 26, it is assumed that one packet of data is first transmitted using 16QAM. Therefore, four post-encoding blocks #1 through #4 are transmitted in 980 symbols. Assuming that the quantity of one packet of data is variable, the amount of data transmitted last will not necessarily be an amount that fills four encoded blocks in 16QAM.

Figures 26A, 26B, 26C:
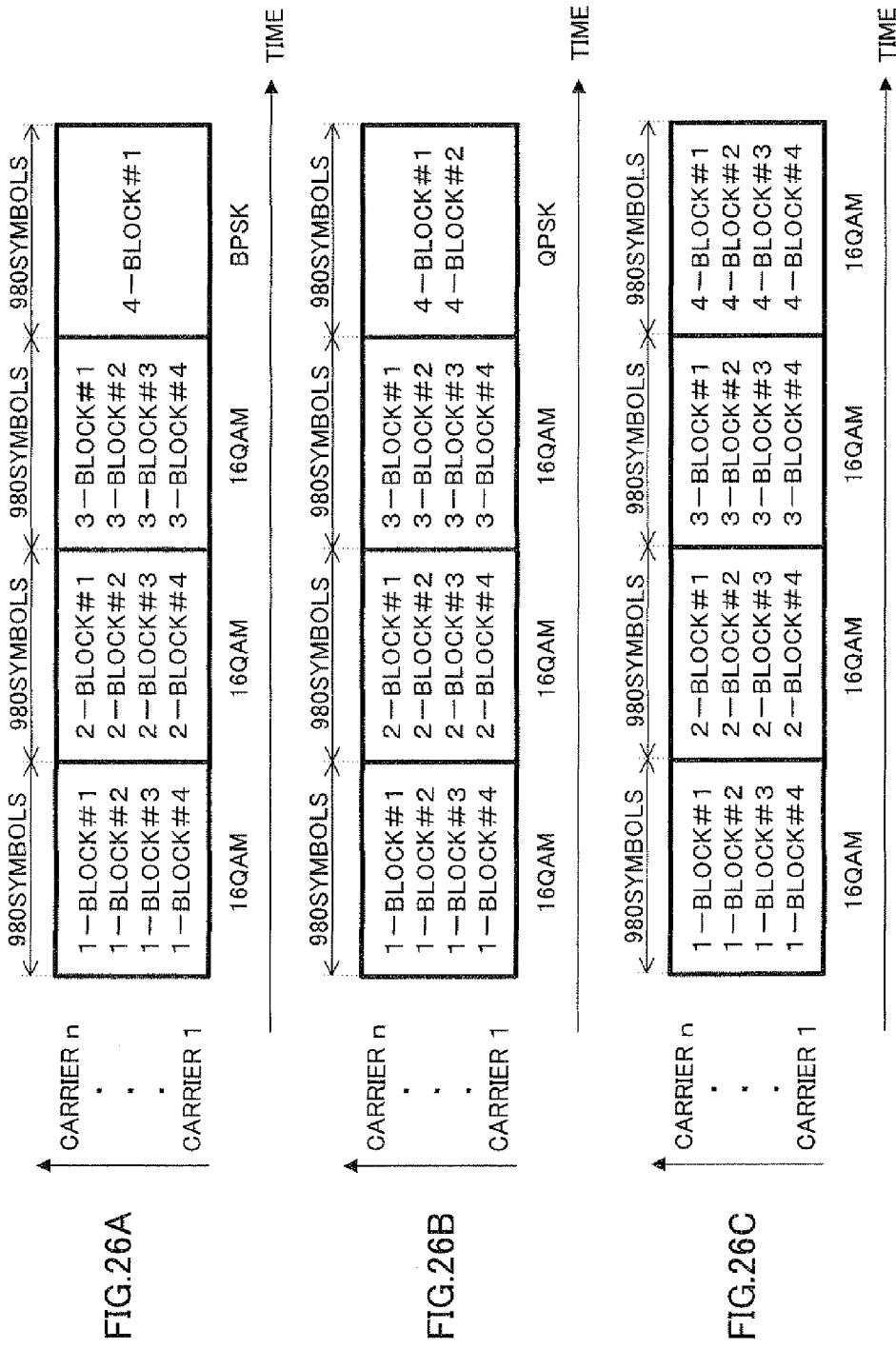
FIG. 26A is a drawing showing how the last block data is assigned when the number of encoded blocks transmitted last is one.
FIG. 26B is a drawing showing how the last block data is assigned when the number of encoded blocks transmitted last is more than one and not more than two.
FIG. 26C is a drawing showing how the last block data is assigned when the number of encoded blocks transmitted last is more than two.

Thus, in this embodiment, if the number of encoded blocks transmitted last is one, BPSK is selected as the modulation method of the last block, and only one encoded block, #1, is transmitted, as shown in FIG. 26A.

If the number of encoded blocks transmitted last is more than one and not more than two, QPSK is selected as the modulation method of the last blocks, and two encoded blocks, #1 and #2, are transmitted, as shown in FIG. 26B. In this case, the kind of arrangement (interleaving) described in FIG. 5B, FIG. 6B, FIG. 7B, or FIG. 8B may be performed.

If the number of encoded blocks transmitted last is more than two, 16QAM is selected as the modulation method of the last blocks, and four encoded blocks, #1 through #4, are transmitted, as shown in FIG. 26C. In this case, the kind of arrangement (interleaving) described in FIG. 5C, FIG. 6C, FIG. 7C, or FIG. 8C may be performed.

By transmitting in this way, one encoded block of data is always transmitted by means of 980 symbols, enabling the influence of fading notches to be reduced, and reception quality to be improved.

As another assignment method, 16QAM may be selected regardless of the number of encoded blocks, and "0" dummy data, for example, may be transmitted for the entire deficient amount of data. With this kind of transmission, one encoded block is still always transmitted by means of 980 symbols, enabling the influence of fading notches to be reduced, and reception quality to be improved.

The above operations are extremely important in order to make reception quality as uniform as possible when packet communication is performed. That is to say, if data of the last encoded block is transmitted as fewer than 980 symbols, the error rate performance of the last encoded block will degrade, and the probability of packet error occurrence will increase.

The method described in this embodiment is effective in preventing this.

(Examples for Comparison)

Using FIG. 27, conventionally commonly implemented assignment methods and their drawbacks will now be described for comparison with the method of uniformly assigning encoded block data to a plurality of symbols according to the present invention.

FIG. 27A shows the received field strength state in a 980-symbol interval as an example of the relationship between time and received field strength as a communication condition.

FIG. 27B shows an example of a frame configuration when the modulation method is BPSK. As an example, FIG. 27B shows the case of a multicarrier transmission method that uses carrier 1 through carrier n, such as OFDM for instance. Therefore, the vertical axis is the frequency axis, on which carriers 1 through n are represented. When the modulation method is BPSK, 980 symbols are necessary to transmit one post-encoding block (block #1) as shown in FIG. 27B.

On the other hand, when the modulation method is 16QAM, since 4 bits can be transmitted in one symbol with 16QAM, 245 symbols are necessary to transmit one post-encoding block. Therefore, if 980 symbols are used, four blocks—block #1, block #2, block #3, and block #4—can be transmitted.

Conventionally, as with BPSK, the usual order of assignment in the time direction is block #1 symbols, block #2 symbols, block #3 symbols, block #4 symbols, as shown in FIG. 27C.

In this case, when BPSK is used as in FIG. 27B, although there are times when the received field strength is good and times when the received field strength is poor for one encoded block even with the kind of communication conditions in FIG. 27A, if decoding is performed in encoded block units, the possibility of errors being corrected through the influence of data with good received field strength is high.

On the other hand, when 16QAM is used as in FIG. 27C, block #1 and block #3 are located on the time axis at times when the received field strength is good, and therefore exhibit good reception quality, whereas block #2 and block #4 are located on the time axis at times when the received field strength is poor, and therefore exhibit poor reception quality. As the number of symbols required by one encoded block decreases as the number of modulation multi-values of the modulation method increases in this way, the system is susceptible to the effects of received field strength notches due to fading. That is to say, the system is susceptible to a fall in reception quality due to notches.

As explained in the above embodiments, a transmitting apparatus of the present invention effectively solves this problem without changing the code length (block size).

Other Embodiments

In above Embodiment 1, the use of one encoding section 11 was taken as a precondition in the description, but as a different embodiment, the above embodiment can also be similarly implemented when the system supports a code with coding rate R=1/2 and 1/3 and a block size of 980 bits, as long as implementation is performed using coding rate R=1/2 and 1/3 separately. Furthermore, the same kind of implementation as in the above embodiment can also be achieved when the system supports a code with coding rate R 1/2 and 1/3 and block sizes of 980 and 1960 bits, as long as implementation is performed separately in each case.

In above Embodiments 2 through 4, a case has been described of a MIMO system using spatial multiplexing in which a multi-antenna transmitting apparatus and multi-antenna receiving apparatus each have two antennas, but this is not a limitation, and similar implementation is also possible for a case in which the number of antennas is increased and the number of modulated signals transmitted is increased. Furthermore, the same kind of effect can also be obtained when the present invention is applied to a system using a spread spectrum communication method.

A multi-antenna transmitting apparatus of the present invention is not limited to the configuration shown in Embodiment 2, and can also be applied, for example, to a MIMO system using an eigenmode. An eigenmode communication method will now be described using FIG. 28.

In a MIMO system, when Channel State Information (CSI) is known not only on the receiving station side but on the transmitting station side, a communication method can be implemented whereby the transmitting station transmits a signal vectored using a transmission channel signature vector to the receiving station by means of a transmitting array antenna, and the receiving station detects and demodulates the transmit signal using a reception channel signature vector associated with the transmission channel signature vector from a receiving array antenna received signal.

In particular, as a communication mode in which multiplex transmission of signals composing a plurality of channels is performed in the communication space, there is an eigenmode that uses a channel matrix singular vector or eigen vector. This eigenmode is a method that uses this singular vector or eigenvector as an aforementioned channel signature vector. Here, a channel matrix is a matrix that has complex channel coefficients of a combination of each antenna element of the transmitting array antenna and all or some of the antenna elements of the receiving array antenna as elements.

As a method whereby the transmitting station obtains downlink channel state information, with TDD using carriers of the same frequency in a radio channel uplink and downlink, it is possible to perform estimating or measuring of channel state information in the transmitting station using the uplink from the receiving station by means of channel reciprocity. On the other hand, with FDD using carriers of different frequencies in the uplink and downlink, accurate downlink CSI can be obtained by the transmitting apparatus by estimating or measuring downlink channel state information in the receiving station and reporting the result to the transmitting station.

A characteristic of an eigenmode is that, particularly when a MIMO system radio channel can be handled as a narrowband flat fading process, MIMO system channel capacity can be maximized. For example, in a radio communication system that uses OFDM, it is usual for design to be carried out so that guard intervals are inserted to eliminate inter-symbol interference due to multipath delayed waves, and OFDM subcarriers are flat fading processes. Therefore, when an OFDM signal is transmitted in a MIMO system, using an eigenmode makes it possible, for example, for a plurality of signals to be transmitted spatially multiplexed in each subcarrier.

As communication methods using a MIMO system, a number of methods have been proposed whereby, as opposed to an eigenmode in which downlink channel state information is assumed to be known in the transmitting station and receiving station, channel state information for a radio channel is known only in the receiving station. BLAST, for example, is known as a method whereby signals are transmitted spatially multiplexed for the same purpose as in an eigenmode. Also, transmission diversity using a space time code, for example, is known as a method of obtaining an antenna space diversity effect at the sacrifice of the degree of signal multiplexing—that is, without increasing capacity. Whereas an eigenmode is a beam space mode in which a signal is transmitted vectored from a transmitting array antenna—in other words, a signal is transmitted after being mapped in beam space—BLAST and space diversity can be considered to be antenna element modes due to the fact that a signal is mapped onto an antenna element.

FIG. 28 shows examples of the configurations of an eigenmode communication transmitter and receiver. Based on channel state information that is the result of estimation of the propagation channel between the transmitting station and receiving station, a transmission channel analysis section 2607 calculates a plurality of transmission channel signature vectors for composing a multiplex channel, and basing a channel matrix formed by means of the channel state information on SVD (Singular Value Decomposition), finds eigenvalues (for example, $\lambda A, \lambda B, \lambda C, \ldots, \lambda X$), and eigen paths (for example, path A, path B, path C, . . . , path X), and outputs these as control information 2608.

In the transmitting station, a multiplex frame generation section 2601 has a transmit digital signal and control information 2608 as input, generates a plurality of transmit frames for mapping onto multiplex channels, and outputs a channel A transmit digital signal 2602A, channel B transmit digital signal 2602B, . . . , channel X transmit digital signal 2602X.

An encoding/arranging (interleaving)/modulation section 2603A has channel A transmit digital signal 2602A and control information 2608 as input, determines the coding rate and modulation method based on control information 2608, and outputs a channel A baseband signal 2604A. The same kind of operations are also performed for channel B through channel X, and channel B baseband signal 2604B through channel X baseband signal 2604X are obtained. To simplify the drawing, the encoding/arranging (interleaving)/modulation sections are shown as one block in FIG. 28, but in actuality, a configuration such as that in above Embodiments 1 through 3 is used, and block encoded data is arranged (interleaved) so that encoded data within one block is assigned to a plurality of data symbols by an arranging (interleaving) section, and supplied to a modulation section.

A vector multiplexing section 2605 has channel A through channel X baseband signals 2604A through 2604X and control information 2608 as input, multiplies channel A through channel X baseband signals 2604A through 2604X individually by a channel signature vector and performs combining, and then performs transmission to the receiving apparatus from a transmitting array antenna 2606.

In the receiving station, a reception channel analysis section 2615 calculates in advance a plurality of reception channel signature vectors for separating multiplexed transmit signals based on channel state information that is the result of estimation of the propagation channel between the transmitting station and receiving station. A multiplex signal separation section 2610 has received signals received by a receiving array antenna 2609 as input, and generates a plurality of received signals obtained by multiplying the channel signature vectors together—that is, a channel A received signal 2611A through channel X received signal 2611X.

A decoding section 2612A has channel A received signal 2611A and transmission method information 2618 as input, performs decoding based on transmission method information 2618 (modulation method and coding rate information), and outputs a channel A digital signal 2613A. The same kind of operations are also performed for channel B through channel X, and channel B digital signal 2613B through channel X digital signal 2613X are obtained.

A transmission method information detection section 2617 has channel A digital signal 2613A ad input, extracts information on the transmitting method—for example, modulation method and coding rate—of each channel, and outputs transmission method information 2618.

A receive data combining section 2614 has channel A through channel X digital signals 2613A through 2613X and transmission method information 2618 as input, and generates a receive digital signal.

The present application is based on Japanese Patent Application No. 2005-198177 filed on Jul. 6, 2005, the entire content of which is expressly incorporated herein by reference.

INDUSTRIAL APPLICABILITY

The present invention has an effect of enabling burst errors to be suppressed with a comparatively simple configuration without changing the block size of an encoded block even when the number of modulation multi-values is increased, and is widely applicable to transmitting apparatuses and multi-antenna transmitting apparatuses that encode transmit data using a block code such as an LDPC code, for example.

The invention claimed is:

1. A modulator comprising:
an encoding section that performs error correction encoding processing on transmit data comprising a plurality of bits to form a plurality of error correction encoding data each comprising a plurality of bits; and
a modulation section that modulates the plurality of error correction encoding data using a QPSK modulation scheme or a 16QAM modulation scheme to generate a modulation symbol, wherein:
the modulation section generates the modulation symbol, using a first error correction encoding data for the QPSK modulation scheme, and, using the first error correction encoding data and a second error correction encoding data for the 16QAM modulation scheme, at a first time slot.

2. The modulator according to claim 1, wherein the modulation section generates 2 bits forming the modulation symbol, using the first error correction encoding data, and generates another 2 bits forming the rest of the modulation symbol, using the second error correction encoding data for the 16QAM modulation scheme.

3. The modulator according to claim 1, wherein the modulation section generates higher order 2 bits forming the modulation symbol using the first error correction encoding data for the 16QAM modulation scheme.

4. The modulator according to claim 1, further comprising an OFDM symbol generating section that generates an OFDM symbol using the modulation symbol.

5. The modulator according to claim 1, wherein the encoding section generates the plurality of error correction encoding data on the transmit data using a block code.

6. The modulator according to claim 1, wherein the encoding section generates the plurality of error correction encoding data on the transmit data using an LDPC code.

7. A modulation method comprising;
performing error correction encoding processing on transmit data comprising a plurality of bits to form a plurality of error correction encoding data each comprising a plurality of bits; and
modulating the plurality of error correction encoding data using a QPSK modulation scheme or a 16QAM modulation scheme to generate a modulation symbol, wherein:
the modulating is performed by generating the modulation symbol, using a first error correction encoding data for the QPSK modulation scheme, and, using the first error correction encoding data and a second error correction encoding data for the 16QAM modulation scheme, at a first time slot.

8. The modulation method according to claim 7, wherein modulating is performed by generating 2 bits forming the modulation symbol, using the first error correction encoding data,
and generating another 2 bits forming the rest of the modulation symbol, using the second error correction encoding data in the 16QAM modulation scheme.

9. The modulation method according to claim 7, wherein the modulating is performed by generating higher order 2 bits forming the modulation symbol using the first error correction encoding data in the 16QAM modulation scheme.

10. The modulation method according to claim 7, further comprising generating an OFDM symbol using the modulation symbol.

11. The modulation method according to claim 7, wherein the error correction encoding processing is executed by generating the plurality of error correction encoding data on the transmit data using a block code.

12. The modulation method according to claim 7, wherein the error correction encoding processing is executed by generating the plurality of error correction encoding data on the transmit data using an LDPC code.

* * * * *